United States Patent
Sakurai et al.

(10) Patent No.: US 7,502,951 B2
(45) Date of Patent: Mar. 10, 2009

(54) ADJUSTMENT SYSTEM AND METHOD FOR AUTOMATICALLY ADJUSTING THE GAIN OF A VOLTAGE SIGNAL

(75) Inventors: Satoshi Sakurai, Shinagawa (JP); Hiroto Inoue, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 336 days.

(21) Appl. No.: 11/089,308

(22) Filed: Mar. 25, 2005

(65) Prior Publication Data

US 2005/0213749 A1 Sep. 29, 2005

(30) Foreign Application Priority Data

Mar. 26, 2004 (JP) ............................. 2004-092173

(51) Int. Cl.
*G06F 1/26* (2006.01)
*G06F 11/30* (2006.01)

(52) U.S. Cl. ..................... 713/340; 363/149; 327/50
(58) Field of Classification Search ................. 713/340; 327/50; 363/149

See application file for complete search history.

(56) References Cited

U.S. PATENT DOCUMENTS

| 5,193,200 A | * | 3/1993 | Asprey et al. | 345/168 |
| 6,577,191 B2 | * | 6/2003 | Lin et al. | 330/136 |
| 6,999,008 B2 | * | 2/2006 | Wang et al. | 341/22 |

FOREIGN PATENT DOCUMENTS

| JP | 2003-46354 | 2/2003 |
| JP | 2003-128185 | 7/2003 |

\* cited by examiner

*Primary Examiner*—Thuan N Du
(74) *Attorney, Agent, or Firm*—Staas & Halsey LLP

(57) ABSTRACT

An automatic adjustment system that includes: a transmission device that includes a constant voltage output unit that outputs a constant-voltage signal to a cable; and a reception device that includes a voltage detecting unit and a control unit. The voltage detecting unit receives the constant-voltage signal transmitted through the cable and detects the voltage of the signal, and the control unit determines signal attenuation based on the voltage detected by the voltage detecting unit and adjusts the gain of a receiving unit that receives the signal from the transmission device. This automatic adjustment system performs gain adjustment on the receiving unit when a cable insertion/pull-out sensing unit senses that the cable is connected to a connector.

16 Claims, 26 Drawing Sheets

CHARACTERISTICS OF THE BURR CAP DIODE

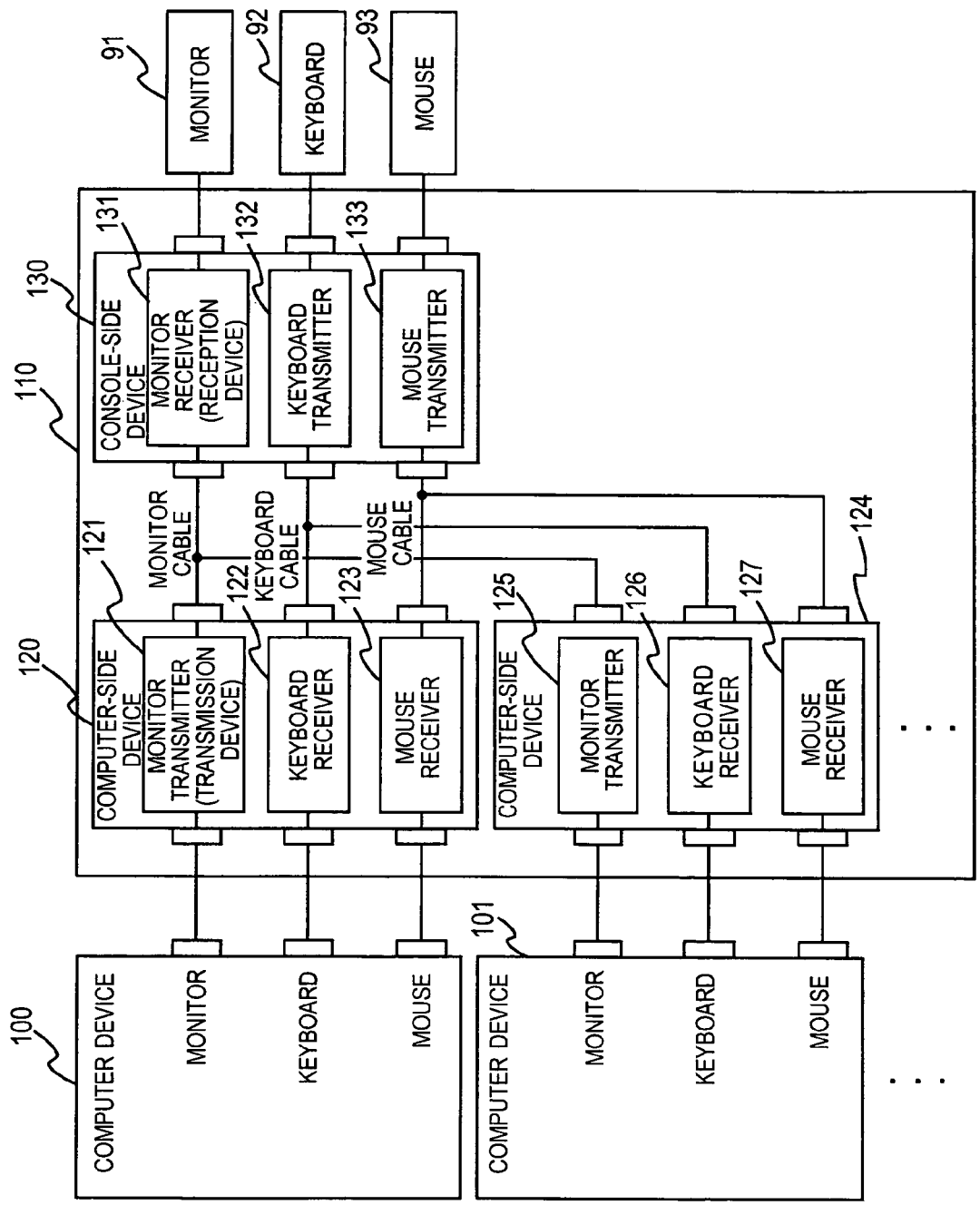

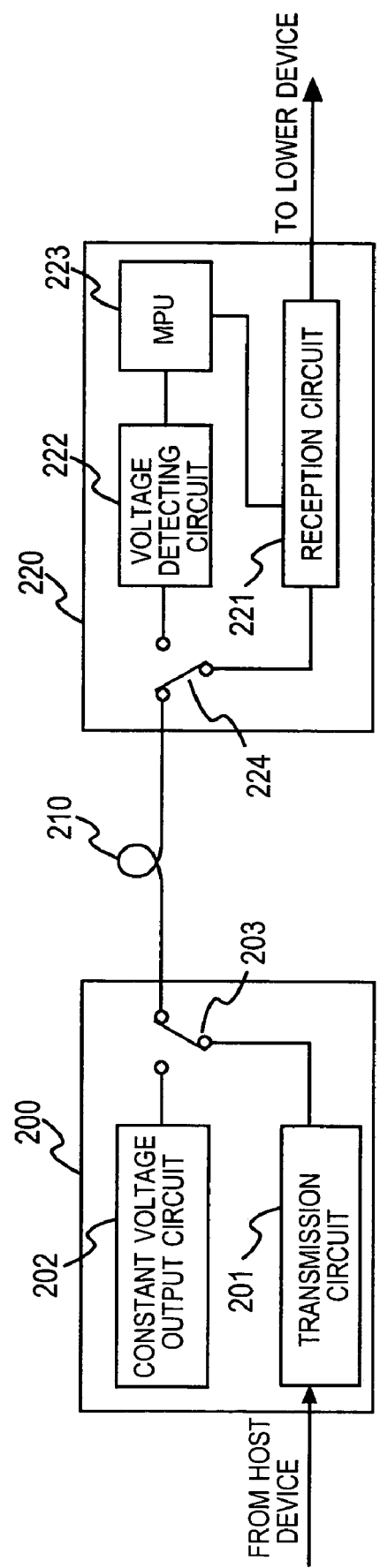

ADJUSTMENT SYSTEM AND METHOD FOR AUTOMATICALLY ADJUSTING THE GAIN OF A VOLTAGE SIGNAL

BACKGROUND OF THE INVENTION

1. Field of the Invention

The present invention relates to an automatic adjustment system for a reception device to correctly retrieve data that is transmitted from a transmission device. The present invention also relates to an automatic adjustment device and an automatic adjustment method.

2. Description of the Related Art

In recent years, more and more attention is being drawn to the remote control unit that controls two or more computers with one set of a keyboard, a mouse, and a display (the set will be hereinafter referred to as a "console"). Where a large number of computer systems are operated at the same time, connecting a console to each of the computer systems greatly complicates the operation and wiring of each of the systems. In such a case, the remote control unit connects one console to the computer systems, thereby enabling access from the console to the computer systems.

To correctly retrieve a signal transmitted from a transmission end to a reception end in the above system, it is necessary to correct the signal at the reception end. Especially, when cables for signal transmission and reception are changed, the correction value for accurately retrieving the data needs to be measured.

When the cable length is changed, the transmission distance also changes. As a result, a change is caused in the attenuation of the transmission signal. Such a change in the attenuation causes a serious problem in the case of an analog signal for which amplitude has a great significance. Also, phase differences among twisted pair signal lines contained in a cable present a problem. For example, when signals such as RGB signals that deeply correlate to one another in terms of the phase and would have trouble with a phase difference are transmitted over a long distance, a phase difference is caused between signals due to the difference in length between the twisted pair signal lines. This results in inaccurate data retrieval.

Japanese Unexamined Patent Publication No. 2003-46354 (Patent Document 1) discloses a structure shown in FIG. 26. In this structure, a constant voltage output circuit 202 that transmits a constant voltage signal through a cable 210 is provided in a transmission device 200. A voltage detecting circuit 222 that receives the constant voltage signal transmitted through the cable 210 is provided in a reception device 220. Also, a MPU 223 that obtains the data of the cable length based on the detected voltage, and adjusts the gain of the reception device 220 is provided in the reception device 220.

In the structure disclosed in Japanese Unexamined Patent Publication No. 2003-202828 (Patent Document 2), a signal line for transmitting a horizontal synchronization signal is also employed as well as the signal lines for transmitting RGB signals to be input from a PC. The phase difference between the horizontal synchronization signal and each of the RGB signals is detected, and the phase differences among the color signals are corrected based on the detected results.

In the structure disclosed in Patent Document 1, however, attenuation is determined from the length of the cable that is connected to the transmission device and the reception device every time the system power source is turned on, and gain adjustment is then performed on analog signals. Therefore, gain adjustment is invariably performed every time the power source is turned on, even though cables are not changed. As a result, a great time loss is caused.

In the structure disclosed in Patent Document 2, it is necessary to prepare a signal line for transmitting the horizontal synchronization signal. As a result, the device becomes large in size.

SUMMARY OF THE INVENTION

It is therefore an object of the present invention to provide an automatic adjustment system, an automatic adjustment device, and an automatic adjustment method in which the above disadvantages are eliminated.

A more specific object of the present invention is to provide an automatic adjustment system, an automatic adjustment device, and an automatic adjustment method by which precise adjustment can be performed on signals that are transmitted from a transmission device through a cable.

The above objects of the present invention are achieved by an automatic adjustment system comprising: a transmission device that includes a constant voltage output unit that outputs a constant-voltage signal to a cable; and a reception device that includes a voltage detecting unit and a control unit, the voltage detecting unit receiving the constant-voltage signal transmitted through the cable and detecting the voltage of the signal, the control unit determining signal attenuation based on the voltage detected by the voltage detecting unit and adjusting the gain of a receiving unit that receives the signal from the transmission device, the automatic adjustment system performing gain adjustment on the receiving unit when a cable insertion/pull-out sensing unit senses that the cable is connected to a connector. When the cable insertion/pull-out sensing unit senses a connection made, it sends the constant-voltage signal to the reception device, which detects the signal attenuation of the constant-voltage signal and adjusts the gain of the receiving unit. Thus, only when the cable is pulled out of the connector and is connected again, the gain of the receiving unit is adjusted. It is therefore possible to perform the gain adjustment only when the cable is replaced with another one or the length of the cable is changed due to the replacement.

According to another aspect of the present invention, there is provided an automatic adjustment system that performs automatic adjustment for signal transmission and reception between a transmission device and a reception device that are connected to a plurality of signal lines, the transmission device comprising a reference signal output unit that outputs reference signals simultaneously to the respective signal lines, the reception device comprising: a receiving unit that receives the reference signals that are output simultaneously to the respective signal lines; a measuring unit that measures each time difference in reaching the receiving unit among the reference signals; and a correcting unit that corrects each phase difference caused in signal transmission through the signal lines, based on the arrival time difference measured by the measuring unit. The reference signals are simultaneously sent to the plurality of signal lines. The receiver device measures each time difference in reading the receiving unit among the reference signals. Each phase difference is corrected based on the arrival time difference measured by the measuring unit. It is thus possible to accurately correct each phase difference. In addition, the invention does not need any synchronizing signal such as the horizontal synchronization signal and the vertical synchronization.

According to yet another aspect of the present invention, there is provided an automatic adjustment device comprising: a cable insertion/pull-out sensing unit that senses that a cable is inserted or pulled out, and, when detecting that the cable is connected, connects a voltage detecting unit that measures a signal voltage to the cable; and a control unit that determines signal attenuation, based on the signal voltage measured by the voltage detecting unit, and adjusts the gain of a receiving unit that receives signals from a transmission end.

According to a further aspect of the present invention, there is provided an automatic adjustment device that performs adjustment to correctly retrieve signals that are output onto a plurality of signal lines, comprising: a receiving unit that receives a plurality of reference signals that are output simultaneously onto the respective signal lines; a measuring unit that measures each time difference in reaching the receiving unit among the reference signals; and a correcting unit that corrects each phase difference caused in signal transmission through the signal lines, based on the arrival time difference measured by the measuring unit.

According to a still further aspect of the present invention, there is provided an automatic adjustment method comprising the steps of: transmitting a constant-voltage signal to a reception end through a cable; receiving the constant-voltage signal transmitted through the cable, and detecting the voltage of the constant-voltage signal that is received by a receiving unit; and determining signal attenuation based on the detected voltage, and adjusting the gain of the receiving unit that receives the transmitted signal.

According to another aspect of the present invention, there is provided an automatic adjustment method that performs automatic adjustment for signal transmission and reception between a transmission device and a reception device that are connected to a plurality of signal lines, the method comprising the steps of: outputting reference signals simultaneously to the respective signal lines, receiving the reference signals that are output simultaneously to the respective signal lines, the reference signals being received by the reception device; measuring each time difference in reaching the receiving unit among the reference signals; and correcting each phase difference, based on the measured arrival time difference.

BRIEF DESCRIPTION OF THE DRAWINGS

Other objects, features and advantages of the present invention will become more apparent from the following detailed description when read in conjunction with the accompanying drawings, in which:

FIG. 25 illustrates the structure of a remote control unit, and a structure in which computer devices are connected to peripheral devices with the remote control unit; and FIG. 26 illustrates a conventional structure disclosed in Patent Document 1.

DESCRIPTION OF THE PREFERRED EMBODIMENTS

The following is a description of embodiments of the present invention, with reference to the accompanying drawings.

First Embodiment

Figure 1:
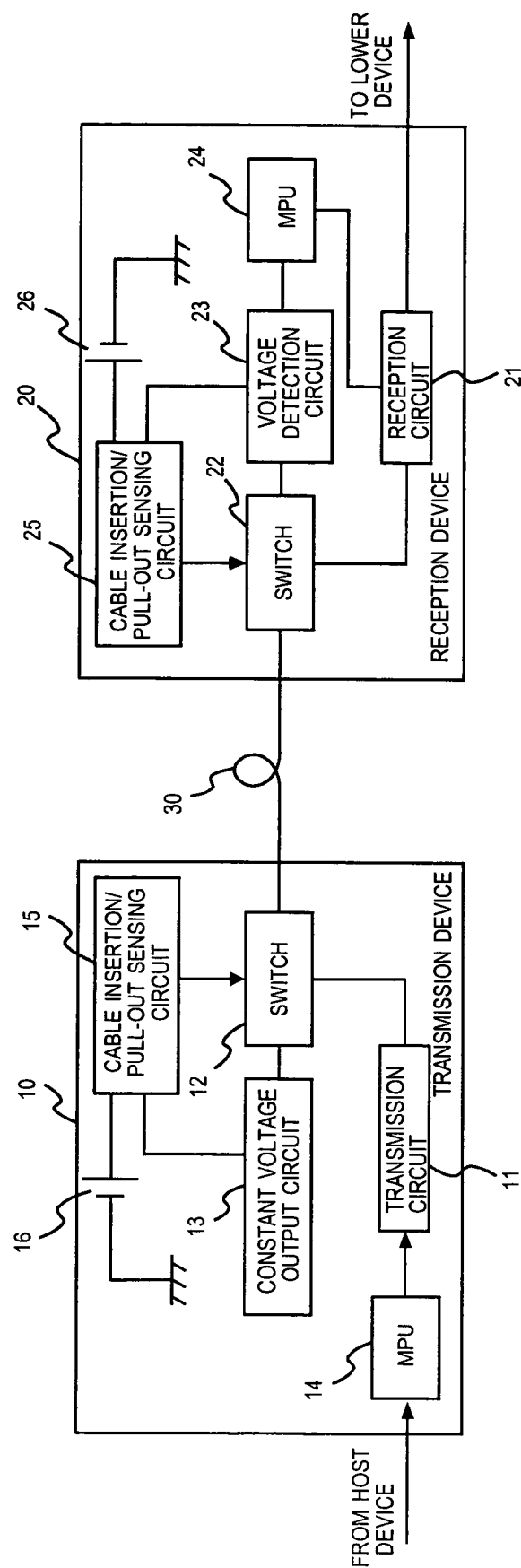
FIG. 1 is a block diagram illustrating the structure of a first embodiment of the present invention.

Referring to FIG. 1, a first embodiment of the present invention is described. As shown in FIG. 1, a transmission device 10 and a reception device 20 are connected to each other with a cable 30 in this embodiment. Although not shown, signal lines are contained in the cable 30. The transmission device 10 includes a transmission circuit 11, a switch 12, a constant voltage output circuit 13, a MPU (Micro Processing Unit) 14, a cable insertion/pull-out sensing circuit 15, and a battery 16. The reception device 20 includes a reception circuit 21, a switch 22, a voltage detecting circuit 23, a MPU 24, a cable insertion/pull-out sensing circuit 25, and a battery 26, as shown in FIG. 1.

The function of each component of the transmission device 10 is now described. The transmission circuit 11 transmits an inherent transmission signal (an analog video signal, for example).

The constant voltage output circuit 13 is activated under the control of the cable insertion/pull-out sensing circuit 15, and outputs a voltage of a constant level to detect a cable length.

The MPU 14 transmits data that is output from a host device (not shown) such as a personal computer to the transmission circuit 11.

When sensing that the cable 30 is pulled out from a cable connector (not shown), the cable insertion/pull-out sensing circuit 15 activates the constant voltage output circuit 13. When sensing the cable 30 is inserted back into the cable connector, the cable insertion/pull-out sensing circuit 15 turns the switch 12 to the constant voltage output circuit 13, and outputs a constant voltage to the cable 30 over a predetermined period of time. The cable insertion/pull-out sensing circuit 15 controls the switch 12 so as to switch the connection of the cable 30 between the transmission circuit 11 and the constant voltage output circuit 13.

The function of each components of the reception device 2 is now described. The reception circuit 21 receives the inherent transmission signal (such as an analog video signal) transmitted from the transmission circuit 11.

The voltage detecting circuit 23 is activated under the control of the cable insertion/pull-out sensing circuit 25, and measures the level of the constant voltage output from the constant voltage output circuit 13 to the cable 30. The voltage level detected by the voltage detecting circuit 23 is output to the MPU 24.

Based on the voltage level output from the voltage detecting circuit 23, the MPU 24 determines the attenuation of the voltage at the cable 30, and performs gain adjustment on the reception circuit 21 in accordance with the determined attenuation.

Like the cable insertion/pull-out sensing circuit 15, when sensing that the cable 30 is pulled out from the cable connector (not shown), the cable insertion/pull-out sensing circuit 25 activates the voltage detecting circuit 23. When sensing that the cable 30 is inserted back into the cable connector, the cable insertion/pull-out sensing circuit 25 turns the switch 22 to the voltage detecting circuit 23. The cable insertion/pull-out sensing circuit 25 controls the switch 22, and switches the connection of the cable 30 between the reception circuit 21 and the voltage detecting circuit 23.

Figure 2:
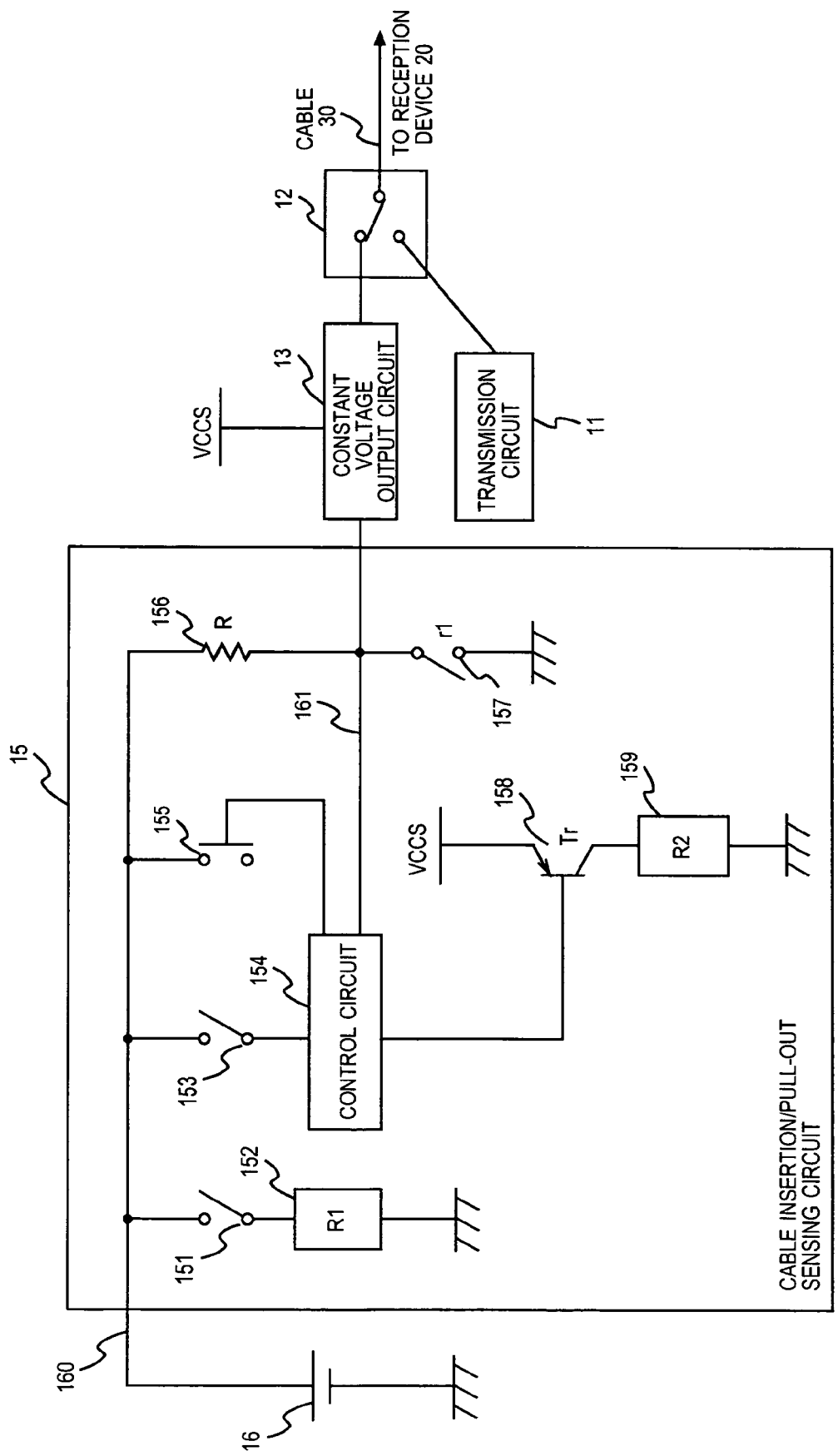
FIG. 2 illustrates the structure of the cable insertion/pull-out sensing circuit.

Referring now to FIG. 2, the structures of the cable insertion/pull-out sensing circuits 15 and 25 are described. It should be noted here that FIG. 2 illustrates only the structure of the cable insertion/pull-out sensing circuit 15, and only the cable insertion/pull-out sensing circuit 15 is described below. Since the cable insertion/pull-out sensing circuit 25 has the same structure as the cable insertion/pull-out sensing circuit 15, explanation of it is omitted.

As shown in FIG. 2, in the cable insertion/pull-out sensing circuit 15, a relay R1 (152) is connected to a wiring 160 via a cable switch 151, and a control circuit (a connection control unit) 154 is connected to the wiring 160 via a cable switch 153. The wiring 160 is connected to the battery 16. The connection of the control circuit (the connection control unit) 154 to the wiring 160 can be switched on and off by a switch 155. A resistance R (156) and a relay contact point r1 (157) are also provided on the wiring 160, and the other end of the relay contact point r1 (157) is grounded.

The cable switches 151 and 153 determine whether the cable 30 is connected to the cable connector (not shown). The cable switches 151 and 153 may be formed with mechanical switches or photosensors. When the cable 30 is inserted into the cable connector, each of the cable switches 151 and 153 is opened (OFF). When the cable 30 is pulled out of the cable connector, each of the cable switches 151 and 153 is closed (ON). The switch 155 is opened and closed under the control of the control circuit (the connection control unit) 154.

When the cable 30 is pulled out from the cable connector and the cable switch 153 is closed (ON), the control circuit (the connection control unit) 154 is activated, receiving power from the battery 16. After activated, the control circuit (the connection control unit) 154 turns the switch 155 into the closed (ON) state, so that the power VCCS can be received from the battery 16, regardless of the condition of the cable switch 153. The control circuit (the connection control unit) 154 also performs control so that the power VCCS can be supplied from the battery 16 to the constant voltage output circuit 13. When a cable sensing signal (described later) becomes high level and the cable 30 is inserted into the cable connector, the control circuit (the connection control unit) 154 turns the switch 155 into the opened state after a predetermined period of time (equivalent to the period of time during which the cable length is measured and gain adjustment is performed). By doing so, the supply of the power VCCS from the battery 16 is cut off, and the switch 155 is put into the OFF state.

When the cable 30 is inserted into the cable connector and the cable switch 151 is opened (OFF), the power supply from the battery 16 to the relay R1 is cut off. The relay contact point r1 (157) of the relay R1 is then opened. With the relay contact point r1 (157) being in the opened state, the wiring 161 that connects the control circuit (the connection control unit) 154 and the constant voltage detecting circuit 13 becomes high level, and the cable sensing signal also becomes high level.

A relay R2 (159) receives the power VCCS from the battery 16 via a transistor Tr (158). The gate of the transistor Tr (158) is connected to the control circuit (the connection control unit) 154. When a wiring 161 becomes high level and the cable sensing signal also becomes high level, the control circuit (the connection control unit) 154 turns on the transistor Tr (158). The relay contact point of the relay R2 (159) is the switch 12. When the transistor Tr (158) is turned on and the power VCCS is supplied to the relay R2, the connection of the switch 12 is switched from the transmission circuit 11 to the constant voltage output circuit 13.

Figure 3:
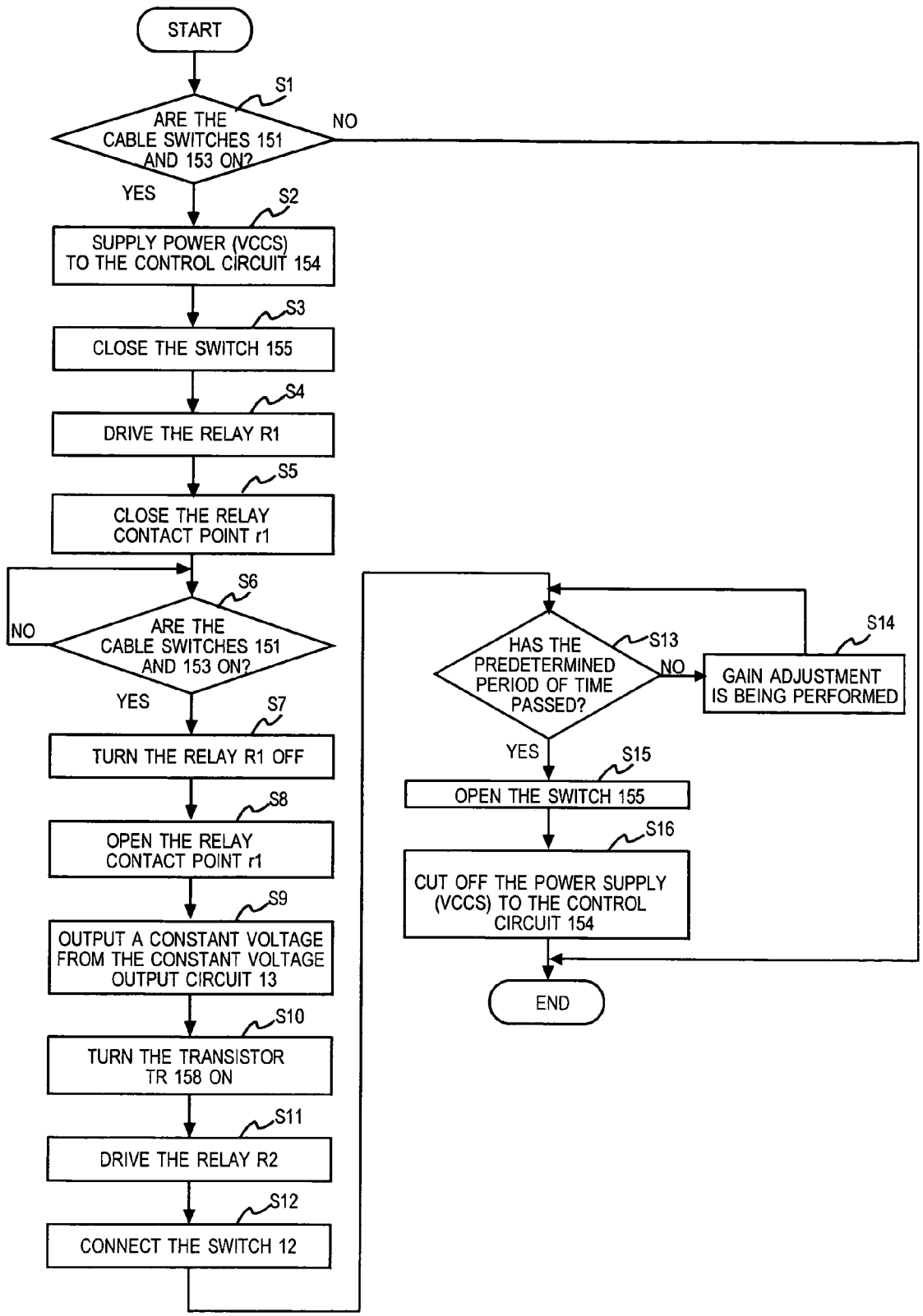
FIG. 3 is a flowchart of the gain adjusting operation.

Referring now to the flowchart of FIG. 3, the operation of the cable insertion/pull-out sensing circuit 15 is described. When the cable 30 is pulled out from the cable connector, the cable switch 153 is put into the closed (ON) state ("YES" in step S1). Accordingly, the power VCCS is supplied from the battery 16 to the control circuit (the connection control unit) 154 (step S2). Receiving the power supply VCCS from the battery 16, the control circuit (the connection control unit) 154 switches to an active state. Upon receipt of the power VCCS, the control circuit (the connection control unit) 154 also puts the switch 155 into the closed (ON) state (step S3), so that the power VCCS can be supplied from the battery 16, regardless of the state of the cable switch 153. Further, the control circuit (the connection control unit) 154 performs such a control operation that the power VCCS can be supplied from the battery 16 to the constant voltage output circuit 13. The cable switch 151 is also put into the closed (ON) state, and the power is supplied to the relay R1. When the power is supplied to the relay R1 (step S4), the relay contact point r1 of the relay R1 is put into the closed state (step S5), and the cable sensing signal becomes low level.

When the cable 30 is inserted into the cable connector, the cable switches 151 and 153 change from the closed (ON) state to the opened (OFF) state ("YES" in step S6). As the cable switch 151 changes from the closed (ON) state to the opened (OFF) state, the current flowing into the relay R1 (152) is shut off (step S7). As the current flowing into the relay R1 (152) is shut off, the relay contact point r1 of the relay R1 (152) is put into the opened (OFF) state (step S8). As the relay contact point r1 is in the opened (OFF) state, the cable sensing signal changes from low level to high level. As the level of the cable sensing signal changes, the constant voltage output circuit 13 outputs a constant voltage to the cable 30.

Also, the control circuit (the connection control unit) 154 applies voltage to the gate of the transistor Tr (158) as the level of the cable sensing signal changes. By doing so, the transistor Tr (158) is turned on (step S10). As the transistor Tr (158) is turned on and the relay R2 is driven (step S11), the connection of the switch 12, which is the relay contact point of the relay R2, is switched from the transmission circuit 11 to the constant voltage output circuit 13 (step S12).

The control circuit (the connection control unit) 154 then determines whether a predetermined period of time (equivalent to the period of time required for performing gain adjustment) has passed since the change in the level of the cable sensing signal. If the predetermined period of time has not passed ("NO" in step S13), the control circuit (the connection control unit) 154 determines that gain adjustment is being performed (step S14), and the constant voltage output circuit 13 continues to output the constant voltage. When the predetermined period of time has passed since the change in the level of the cable sensing signal ("YES" in step S13), the control circuit (the connection control unit) 154 puts the switch 155 into the opened state (step S15), and cuts off the supply of the power VCCS from the battery 16 (step S16).

As described above, in accordance with this embodiment, the insertion or pulling out of the cable to and from the cable connector is detected, and gain is adjusted so as to conform to the length of the inserted cable. In this manner, gain adjustment is not constantly performed when the power is on, and the signal transmission time can be shortened.

Also, as the batteries 16 and 26 are provided in the transmission device 10 and the reception device 20, respectively, gain adjustment can be automatically performed even when the system power supply is not turned on, as long as cables are changed.

Second Embodiment

Figure 4:
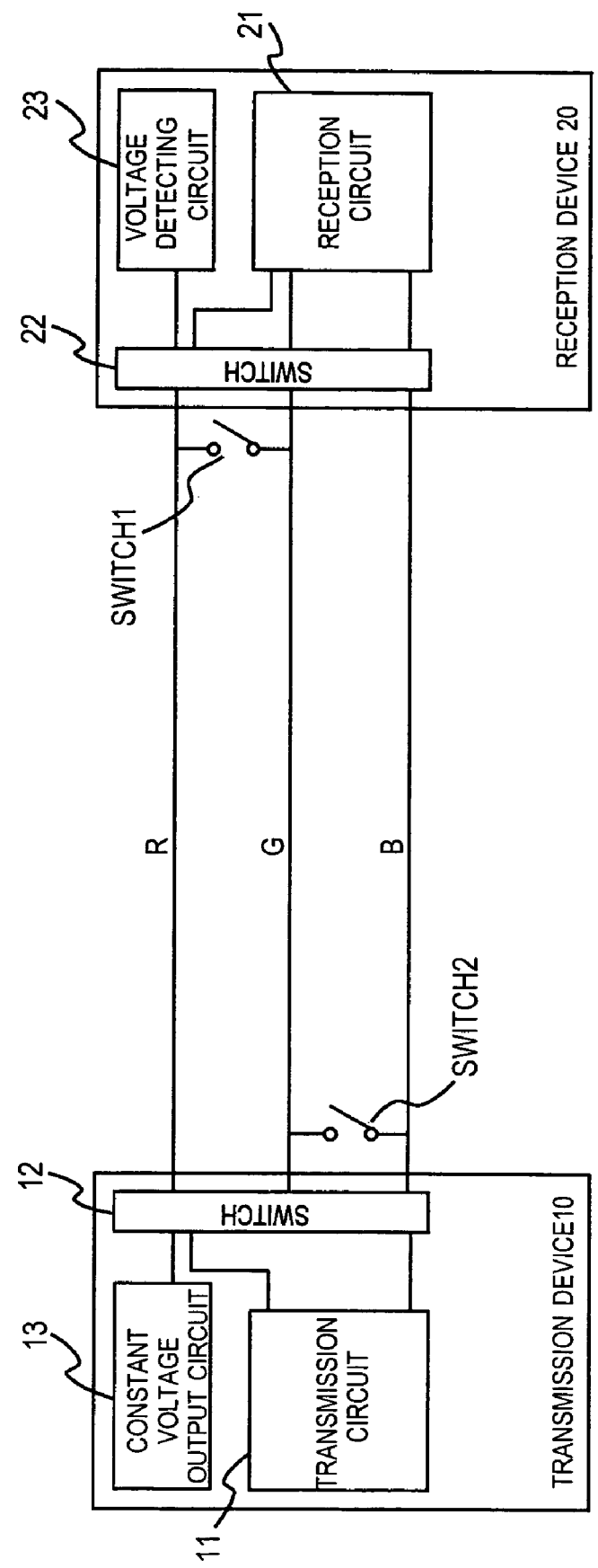
FIG. 4 is a block diagram illustrating the structure of a second embodiment of the present invention.

Next, a second embodiment of the present invention is described. In this embodiment, if the cable 30 is too short to measure the attenuation of a signal, the signal lines contained in the cable 30 are serial-connected so as to elongate the line length. With the elongated line length, signal attenuation is measured. Referring now to FIG. 4, this embodiment is described in detail. In FIG. 4, three signal lines for transmitting the color signals of R (Red), G (Green), and B (Blue) are shown. The constant voltage output circuit 13 and the voltage detecting circuit 23 described in the above description of the first embodiment are normally connected to the signal line for transmitting the color signal of R shown in FIG. 4. If the cable 30 is too short to measure signal attenuation, the switch (a switching unit) 22 shown in FIG. 4 is controlled to switch the connection of the voltage detecting circuit 23 from the signal line for transmitting the color signal of R to the signal line for transmitting the color signal of B. A switch (a switching unit) 1 and another switch (a switching unit) 2 are then put into a closed (ON) state so as to serial-connect the color signal lines of R, G, and B. Even if one signal line is too short to measure signal attenuation, the three signal lines are serial-connected to maintain a sufficient line length to measure the signal attenuation. In that case, the measured attenuation should be divided by 3 to determine the attenuation of each single signal line.

Third Embodiment

Next, a third embodiment of the present invention is described. In this embodiment, a cable length is measured several times, and attenuation is determined by obtaining the average value of the measured results. In this manner, adverse influence of external noise or the like that can be found in the cable 30 can be eliminated.

Figure 5:
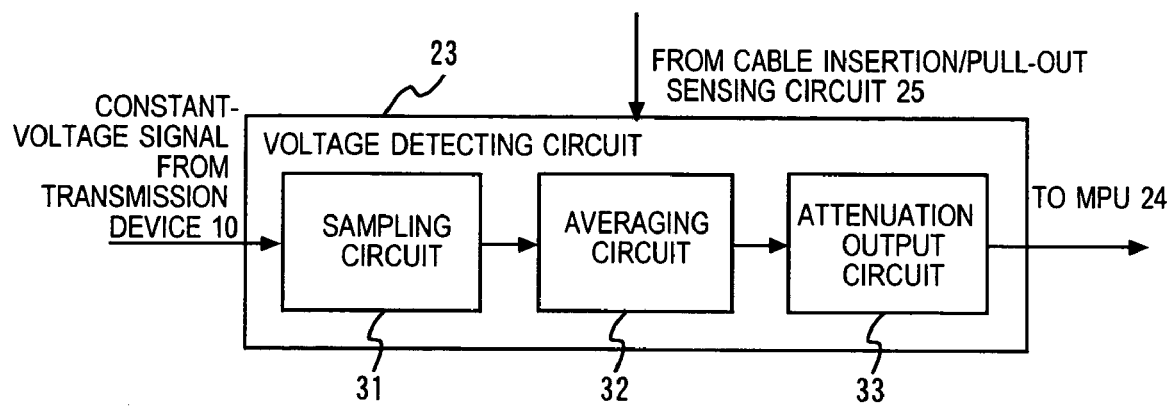
FIG. 5 is a block diagram illustrating the structure of a voltage detecting circuit of a third embodiment of the present invention.

FIG. 5 illustrates the structure of the voltage detecting circuit 23 of this embodiment. As shown in FIG. 5, the voltage detecting circuit 23 measures the level of a constant voltage at the reception end of the cable 30. Here, the constant voltage is output to the cable 30 from the constant voltage output circuit 13. The measurement is repeated N times, with N being a predetermined number. After N pieces of measurement data are obtained, an averaging circuit 32 eliminates the data representing the greatest value and the smallest value from the N pieces of measurement data, and determines the average value. The data with the highest voltage level and the lowest voltage level are greatly affected by external noise. Therefore, those data are eliminated to reduce the adverse influence of the noise. An attenuation output circuit 33 determines the signal attenuation at the cable 30, based on the average value of the voltage levels determined by the averaging circuit 32.

Figure 6:
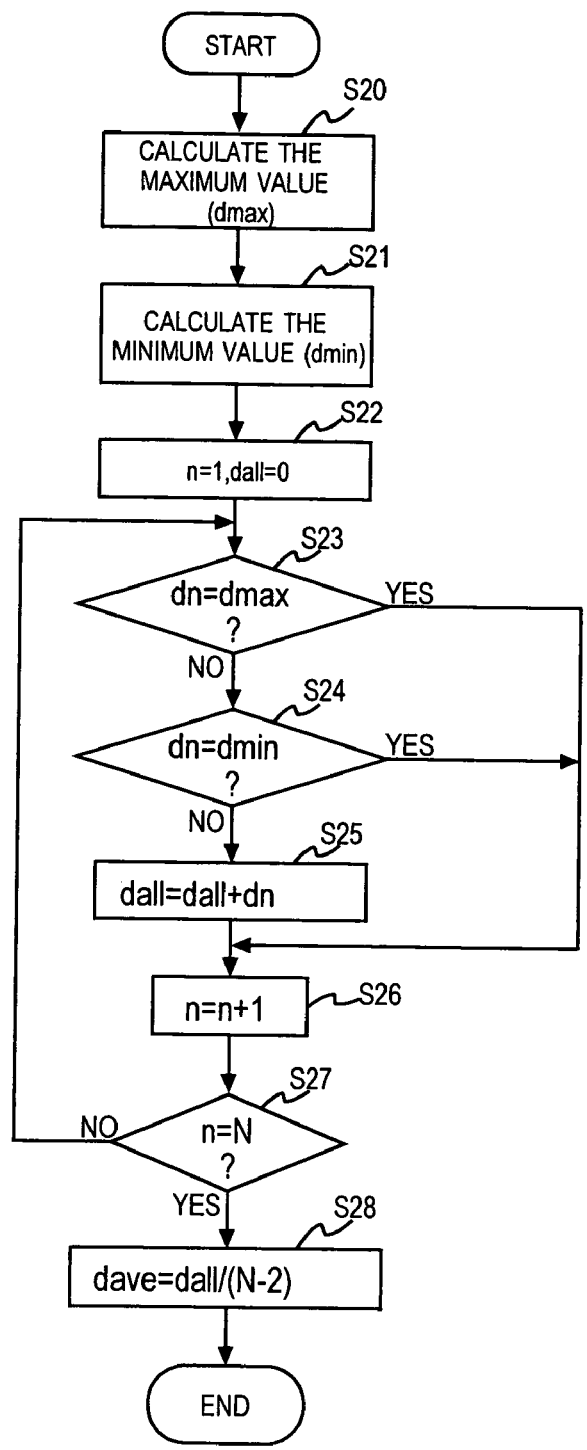
FIG. 6 is a flowchart of the operation in accordance with the third embodiment.

Referring now to the flowchart of FIG. 6, the average value calculating operation of the voltage detecting circuit 23 is described in detail. First, a sampling circuit 31 selects the data of the largest value among the N pieces of measurement data (step S20), and the data of the smallest value among the N pieces of measurement data (step S21). Next, "1" is set to a counter n that counts the number of measurement data pieces, and "0" is set to the value of an adder "dall" that adds up the measurement data (step S22).

The voltage detecting circuit 31 then determines whether the nth data dn is equal to the maximum value (dmax) that is detected in advance (step S23). If it is ("YES" in step S23), the value of the data dn is eliminated. If the data dn is not equal to the maximum value ("NO" in step 23), the voltage detecting circuit 31 determines whether the data dn is equal to the minimum value (dmin) that is detected in advance (step S24). If it is ("YES" in step S24), the value of the data dn is eliminated. If the data dn is not equal to the minimum value, the value of the data dn is added to the value "dall" (step S26). After the addition with the adder, the value of n is incremented by 1, and the operation moves onto the process for the next value (dn+1).

The above procedures are repeated until the value of n becomes equal to N, which is the number of measurement data pieces. When n becomes equal to N ("YES" in step S27), the value "dall" of the adder is divided by (N−2) to obtain the average value "dave" (step S28).

Fourth Embodiment

Figure 7:
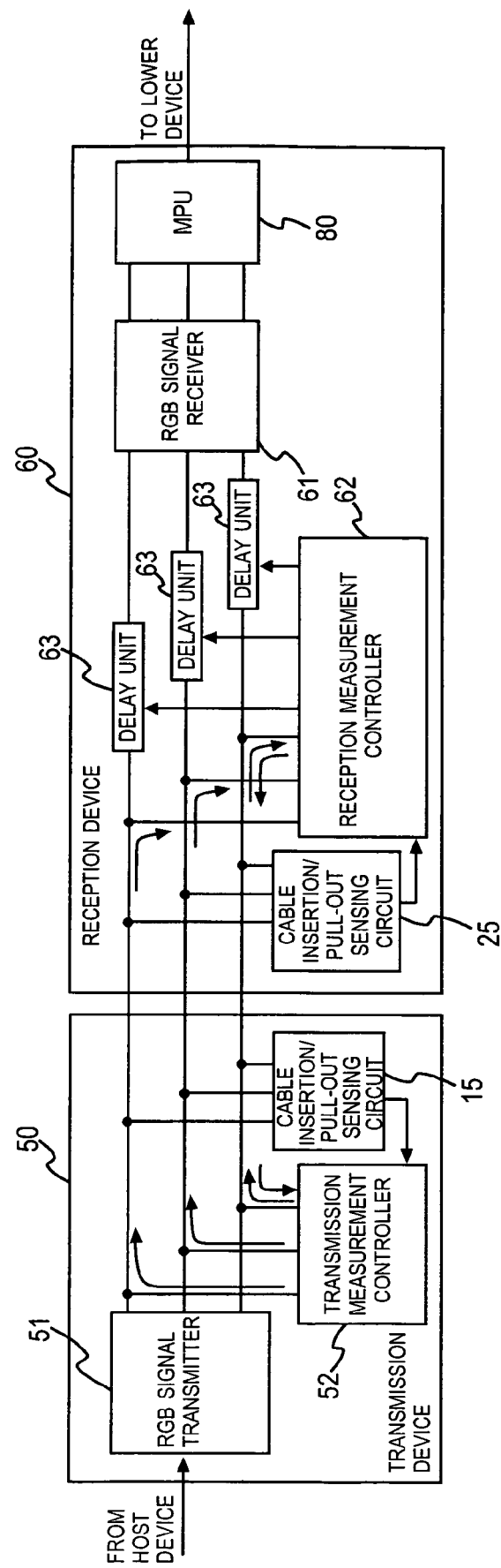
FIG. 7 is a block diagram illustrating the structure of a fourth embodiment of the present invention.

Next, a fourth embodiment of the present invention is described. In this embodiment, a transmission device 50 and a reception device 60 are connected to each other with a cable containing three signal lines, as shown in FIG. 7, and signal transmission and reception are performed through the signal lines. The three signal lines are provided for transmitting the color signals of R, G, and B to be transmitted from the transmission device 50 to the reception device 60.

As shown in FIG. 7, the transmission device 50 includes: a RGB signal transmitter 51 that transmits the color signals of R, G, and B; a transmission measurement controller 52 that measures the phase difference caused by the difference between the line lengths of the signal lines of R, G, and B; and a cable insertion/pull-out sensing circuit 15 that is the same as the cable insertion/pull-out sensing circuit 15 of the first embodiment.

As shown in FIG. 7, the reception device 60 includes: a RGB signal receiver 61 that receives the color signals of R, G, and B, which are transmitted from the transmission device 50; a reception measurement controller 62 that measures the phase difference among the color signals of R, G, and B, based on reference signals transmitted from the transmission device 50, and corrects the measured phase difference; delay units 63 that delays the respective color signals by a time designated by the reception measurement controller 62; and a cable insertion/pull-out sensing circuit 25 that is the same as the cable insertion/pull-out sensing circuit 25 of the first embodiment.

Figure 8:
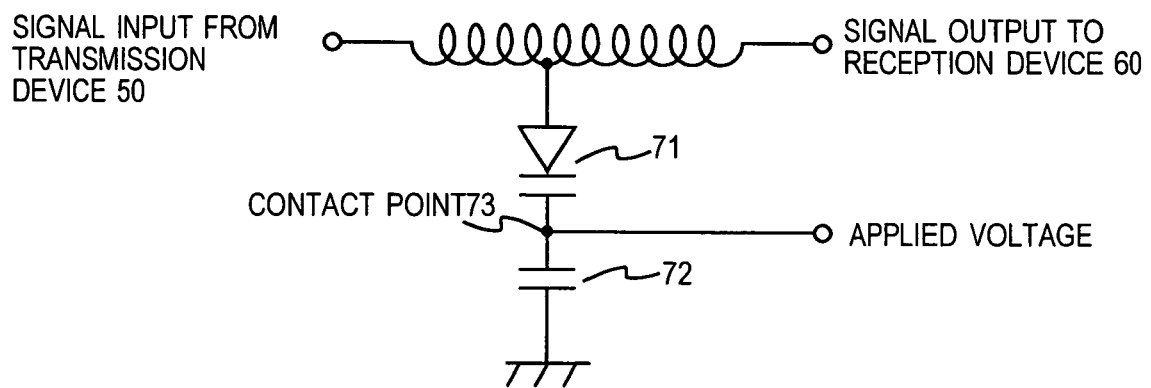
FIG. 8 illustrates the structure of a delay unit.
Figure 9:
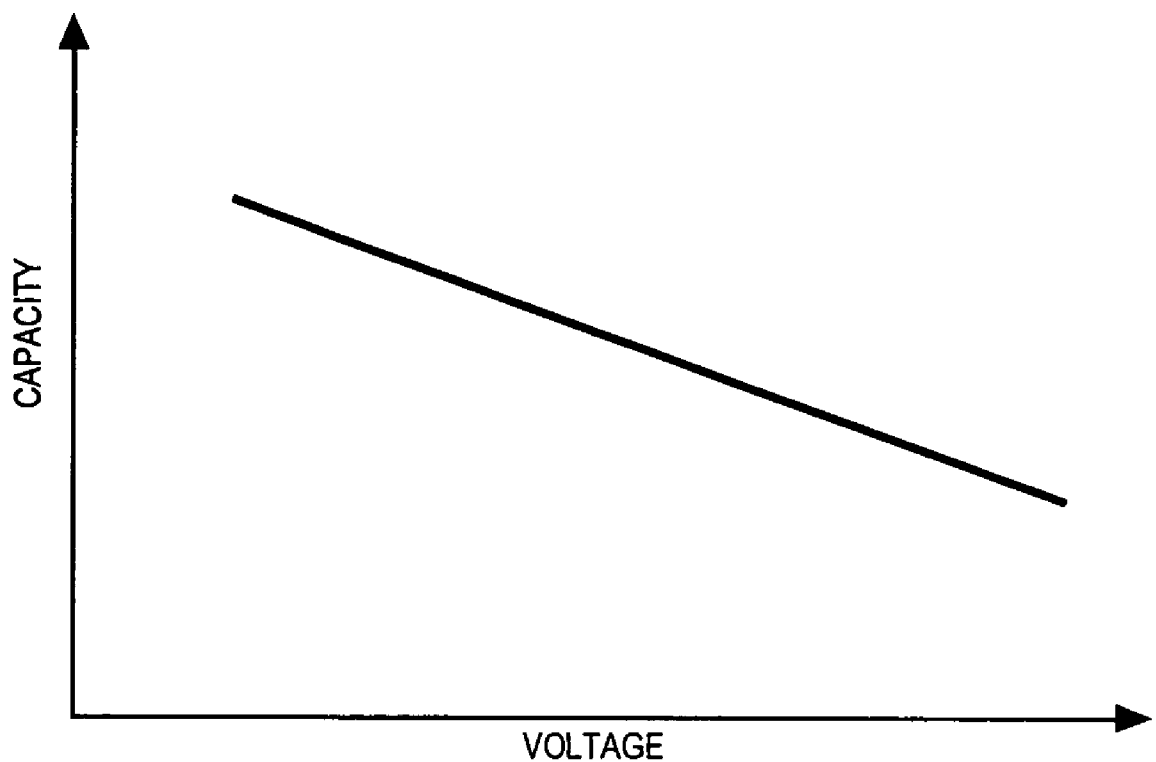
FIG. 9 illustrates the characteristics of the burr cap diode of the delay unit.

Referring now to FIG. 8, the structure of each delay unit 63 is described in detail. Each of the delay units 63 has a burr cap diode 71 and a capacitor 72 connected in series to each corresponding signal line, as shown in FIG. 8. The burr cap diode 71 can function as a capacitor, having a reverse-direction voltage applied thereto. Also, the voltage to be applied to a contact point 73 that is the connection point between the burr cap diode 71 and the capacitor 72 is adjusted to control the capacity of the burr cap diode 71 as shown in FIG. 9.

Figure 10:
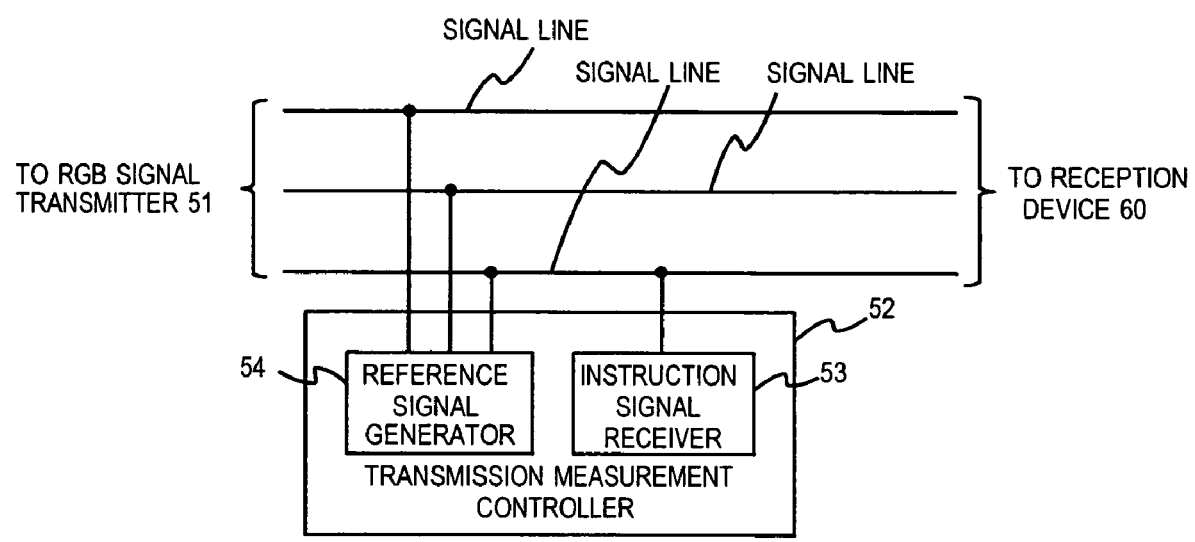
FIG. 10 is a block diagram illustrating the structure of the transmission measurement controller.

Referring now to FIG. 10, the transmission measurement controller 52 is described. As shown in FIG. 10, the transmission measurement controller 52 includes an instruction signal receiver 53 and a reference signal generator 54. The instruction signal receiver 53 is connected to one of the three signal lines, while the reference signal generator 54 is connected to all the three signal lines.

The instruction signal receiver 53 receives an instruction signal that is input from an instruction signal transmitter 64 (described later) of the reception device 60. The instruction signal is to instruct the transmission device 50 to transmit reference signals for measuring the phase differences among the signals of R, G, and B. The transmission measurement controller 52, which has received the instruction signal through the instruction signal receiver 53, then outputs the reference signals to the signal lines through the reference signal generator 54. The reference signals are to supply the color signals of R, G, and B to the signal lines for transmitting the color signals of R, G, and B. The reference signals are output several times at predetermined intervals.

Figure 11:
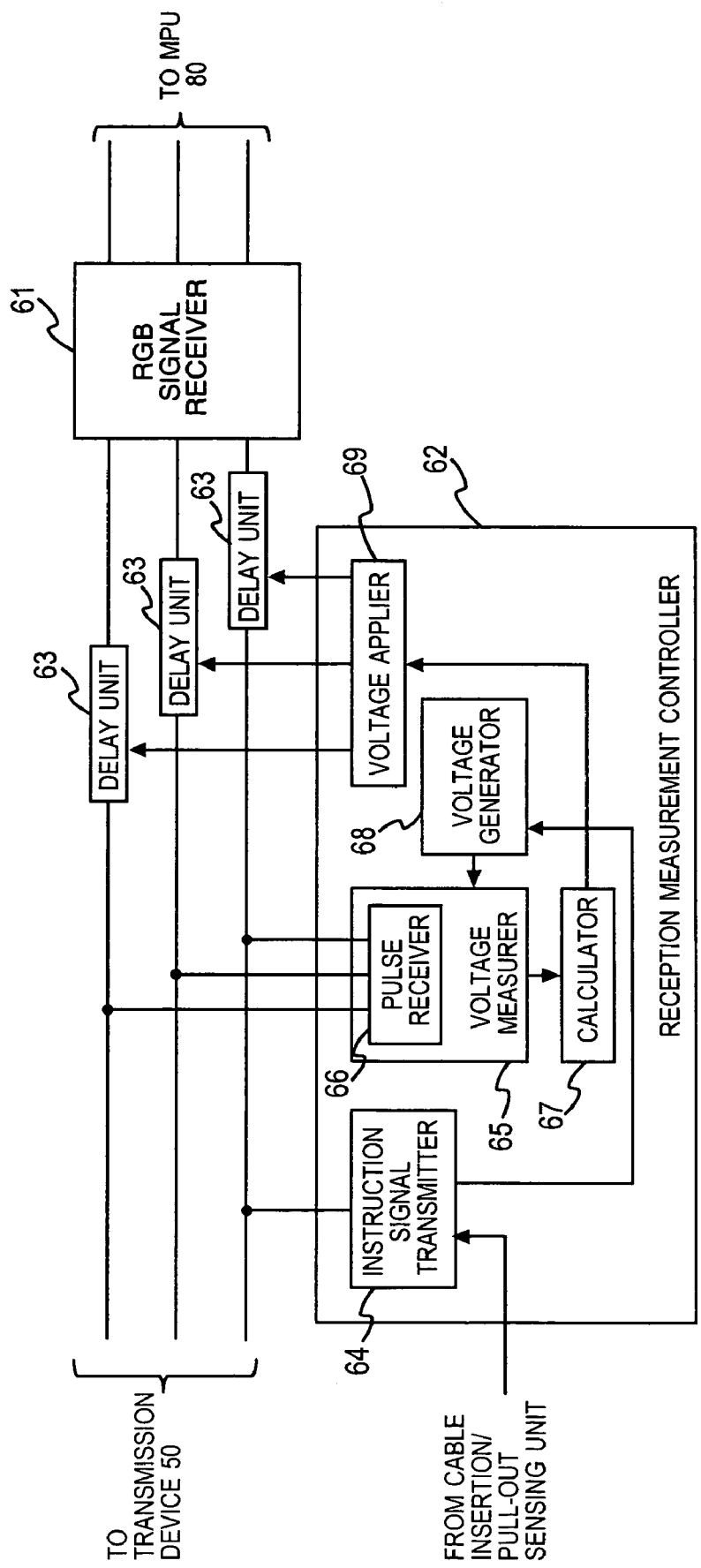
FIG. 11 is a block diagram illustrating the structure of the reception measurement controller.

Referring now to FIG. 11, the structure of the reception measurement controller 62 is described. As shown in FIG. 11, the reception measurement controller 62 includes the instruction signal transmitter 64, a voltage measurer (a delay time measuring unit) 65 that has a pulse receiver 66, a calculator (a correcting unit) 67, a voltage generator 68, and a voltage applier 69.

The instruction signal transmitter 64 requests the transmission device 50 to transmit the reference signals, so that the phase difference among the signal lines is measured again, when a signal line is inserted or pulled out for a signal line exchange or the like. The instruction signal transmitter 64 and the instruction signal receiver 53 are of course connected to the same signal line.

Figure 12:
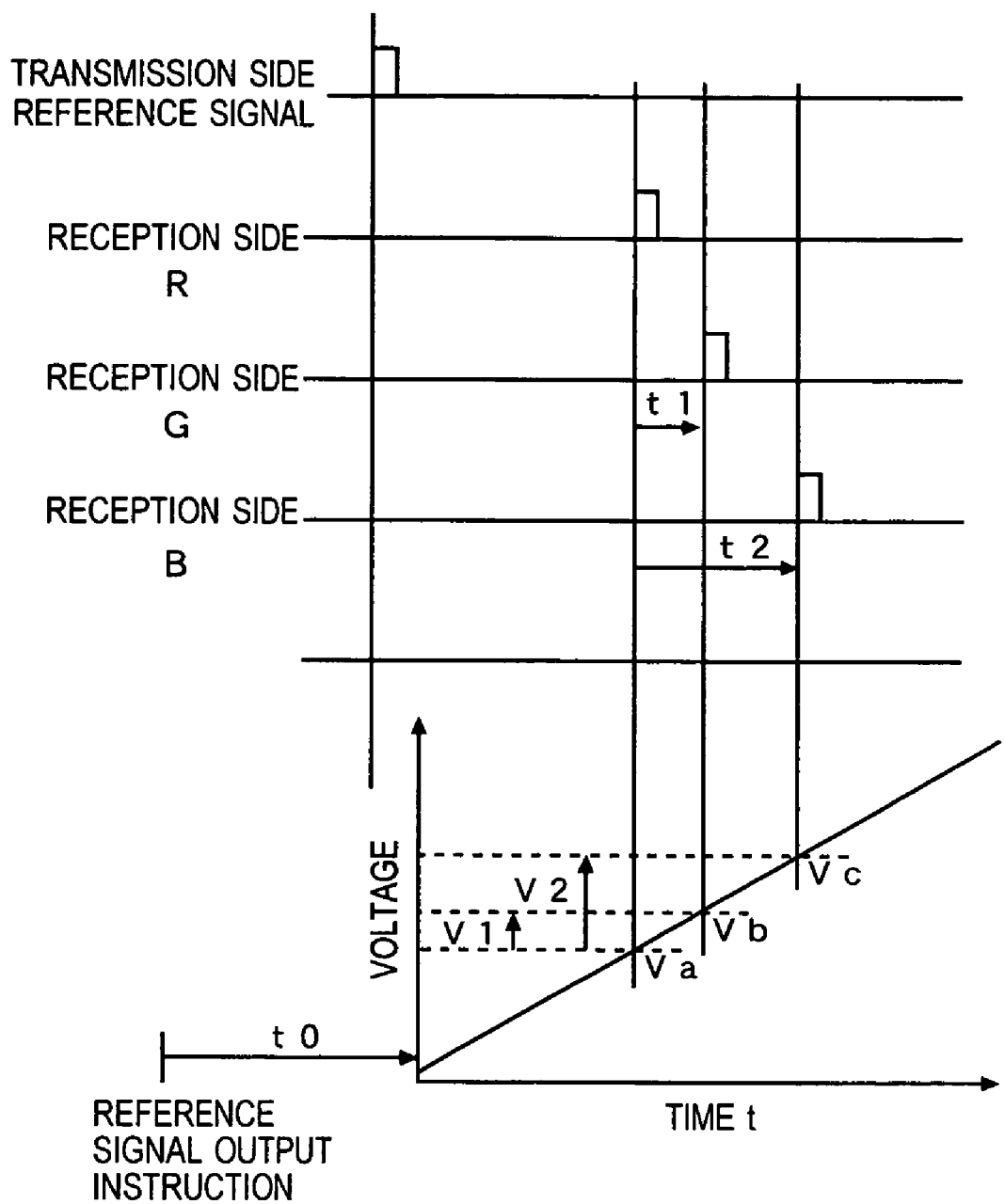
FIG. 12 illustrates the method of measuring the delay time of each reference signal in accordance with the fourth embodiment.

When time t0 has passed since the request for a reference signal output, the voltage generator 68 generates a voltage that linearly varies as shown in FIG. 12, and outputs the voltage to the voltage measurer (the delay time measuring unit) 65. The voltage measurer (the delay time measuring unit) 65 measures the voltage of the voltage generator 68 when the pulse receiver 66 receives each reference signal of R, G, and B. Hereinafter, the voltage of the color signal that is first received by the pulse receiver 66 is referred to as Va, the voltage of the color signal that is second received is referred to as Vb, and the voltage of the color signal that is third received is referred to as Vc. In FIG. 12, the voltage that is output from the voltage generator 68, and the voltages at the time of receiving the first, second, and third signals are shown. The voltage differences between the signal that first reaches the pulse receiver 66 and the other signals are determined, and the voltage differences V1 and V2 are output to the calculator (the correcting unit) 67. Since the voltage that is output from the voltage generator 68 linearly varies in value, the voltage differences V1 and V2 are determined so as to determine the differences between the periods of time required for reaching the reception device 60. The voltage measurer (the delay time measuring unit) 65 analog-to-digital converts the voltage differences V1 and V2, and outputs the converted values to the calculator (the correcting unit) 67.

The calculator (the correcting unit) 67 obtains delay time differences from the voltage differences V1 and V2 determined by the voltage measurer (the delay time measuring unit) 65. The calculator 67 then determines the voltage to be applied to the burr cap diode of the delay unit 63 provided on each signal line.

The voltage applier 69 applies the voltage, which is determined by the calculator (the correcting unit) 67, to the burr cap diode of the delay unit 63 provided on the corresponding signal line. By applying the adjusted voltage from the voltage applier 69 to the burr cap diode, the RGB signal receiver 61 can receive the RGB signals without a phase difference.

Figure 13:
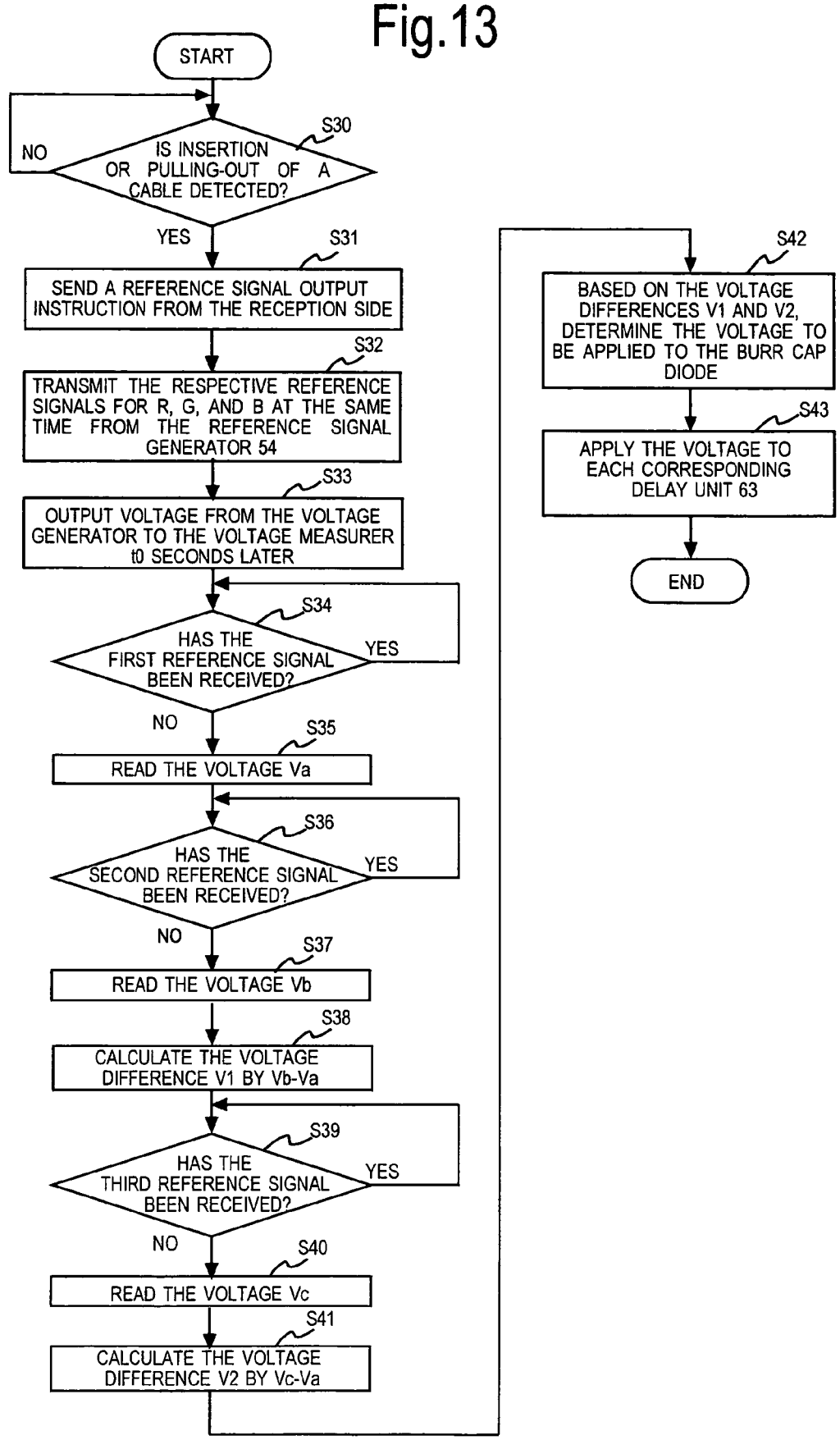
FIG. 13 is a flowchart of the operation in accordance with the fourth embodiment.

Referring now to the flowchart of FIG. 13, the phase difference correcting operation is described. When the cable is pulled out from the cable connector (not shown), whether a new cable is inserted is determined (step S30). If it is determined that a cable is inserted into the cable connector ("YES" in step S30), the instruction signal transmitter 64 of the reception measurement controller 62 outputs a signal to instruct the transmission device 50 to transmit reference signals (step S31). Upon receipt of the instruction to transmit the reference signals, the transmission device 50 outputs the reference signals for R, G, and B at the same time through the reference signal generator 54 (step S32). When the instruction signal is transmitted from the instruction signal transmitter 64, the voltage generator 68 starts outputting voltage to the voltage measurer (the delay time measuring unit) 65 t0 seconds after the output of the instruction signal (step S33).

The voltage measurer (the delay time measuring unit) 65 receives the respective reference signals of R, G, and B, which are transmitted from the transmission device 50, through the pulse receiver 66. The voltage measurer 65 then measures the voltage at the time of the signal reception. The voltage of the reference signal that is first received ("YES" in step S34) is set as Va (step S35), and the voltage of the reference signal that is second received ("YES" in step S36) is set as Vb (step S37). After the voltages Va and Vb are measured, the voltage difference Vb–Va is determined, and the obtained value is set as V1 (step S38).

The voltage Vc of the reference signal that is third received ("YES" in step S39) is then measured (step S40). The voltage difference Vc–Va is determined, and the obtained value is set as V2 (step S41). Based on the voltage differences V1 and V2, the voltage to be applied to each burr cap diode is determined (step S42). The calculator (the correcting unit) 67 determines each signal delay time from the voltage differences V1 and V2, and then determines the voltage to be applied to each burr cap diode. The determined voltage to be applied is output from the calculator (the correcting unit) 67 to the voltage applier 69. The voltage applier 69 applies the voltage output from the calculator (the correcting unit) 67 to the burr cap diode of the corresponding delay unit 63 (step S43).

In this embodiment, the phase differences among the RGB signals are determined after insertion or pulling-out of a cable is detected. However, the phase difference may be measured not only when insertion or pulling-out of a cable is detected but also when the power supply is switched on or at predetermined regular intervals.

Fifth Embodiment

In this embodiment, the measurement of the phase differences among the RGB signals performed in the fourth embodiment is repeated several times to obtain several sets of measurement data. The average value of the several sets of measurement data is then calculated so as to increase the precision of the converted values.

Figure 14:
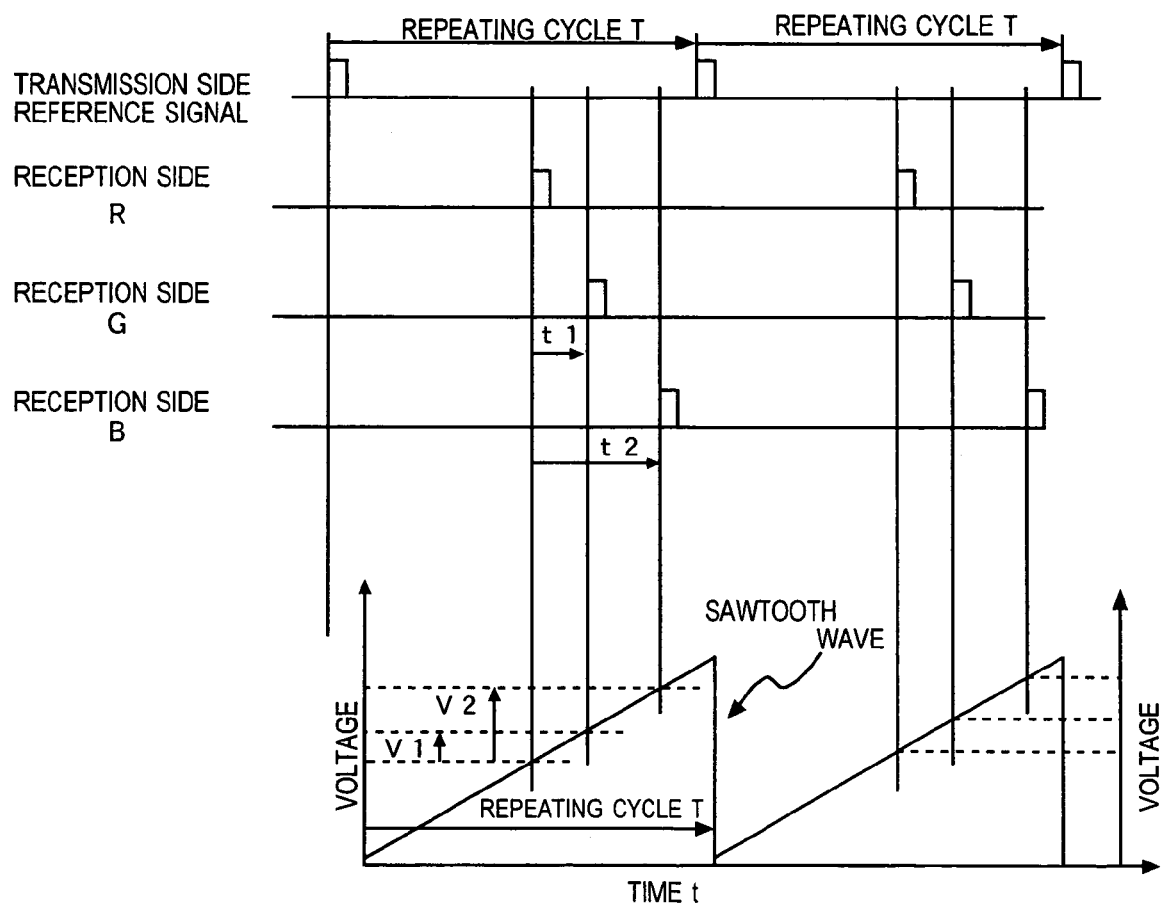
FIG. 14 illustrates the method of measuring the delay time of each reference signal in accordance with a fifth embodiment of the present invention.

The reference signal generator 54 of the transmission device 50 outputs the reference signals for R, G, and B in constant repeating cycles T, as shown in FIG. 14. The voltage generator 68 of the reception device 60 also outputs a sawtooth wave in the repeating cycles T, as shown in FIG. 14. The sawtooth wave increases or decreases continuously or stepwise with time. The reference signal output cycles are synchronized with the sawtooth wave output cycles, so that the measurement can be repeated without a delay.

Figure 15:
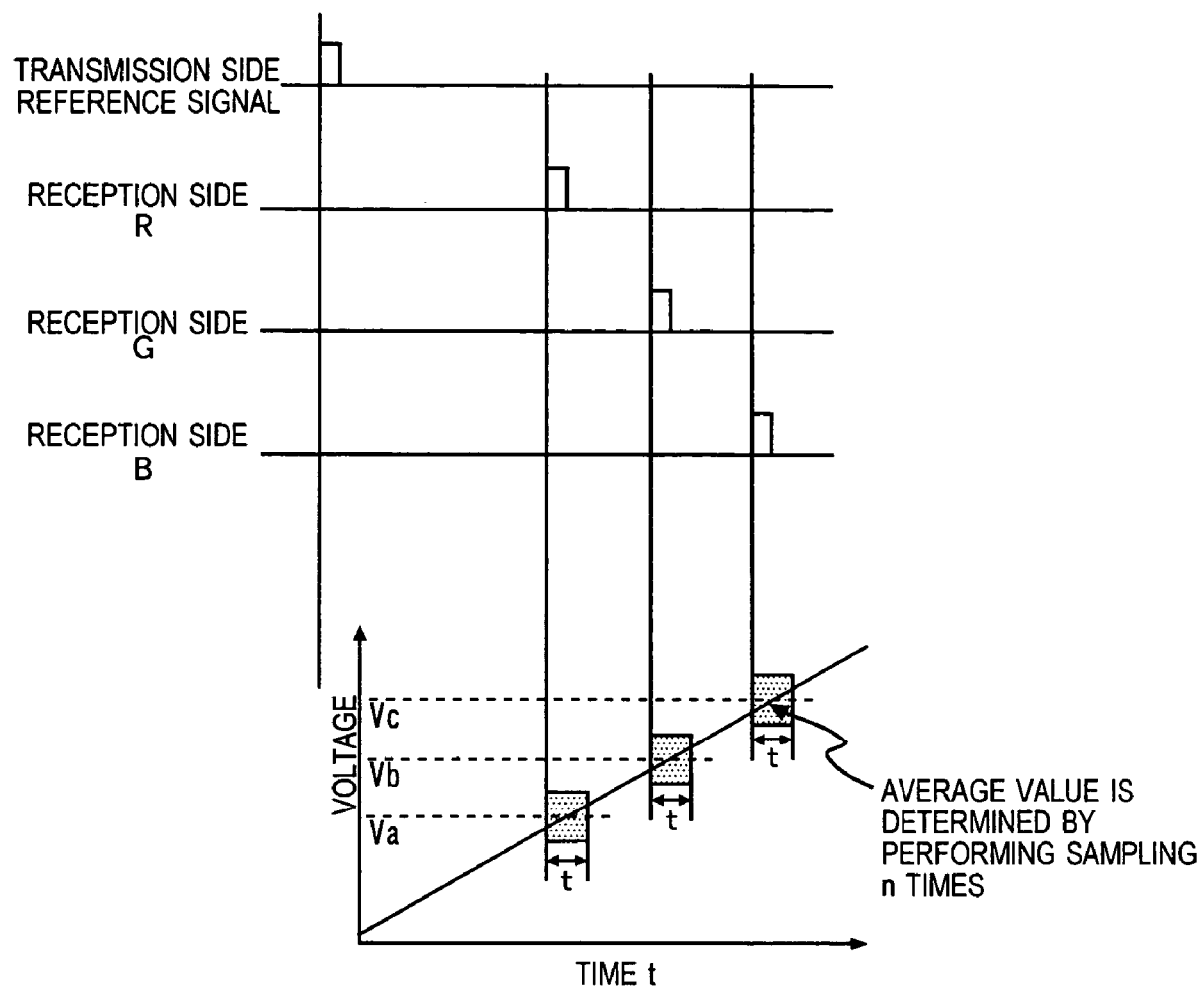
FIG. 15 illustrates the method of measuring the delay time of each reference signal in accordance with the fifth embodiment.
Figure 16:
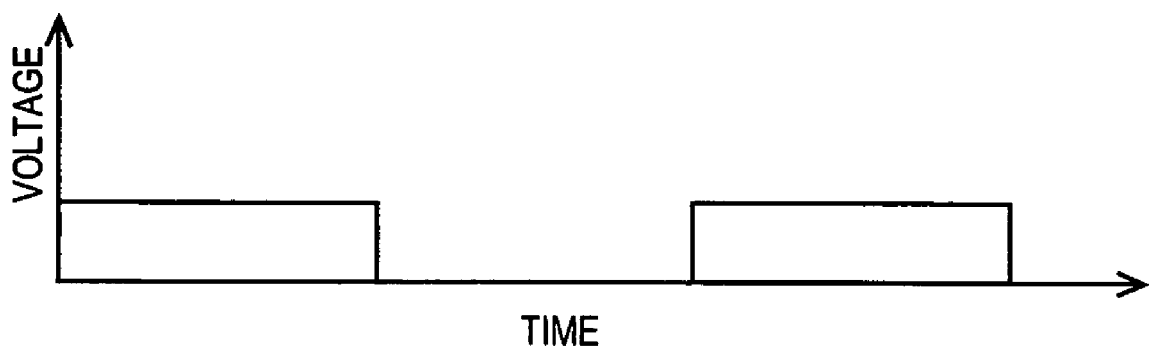
FIG. 16 illustrates the waveform of each reference signal to be output from the reference signal generator in accordance with a sixth embodiment of the present invention.

During each of the repeating cycles T, the voltage measurer (the delay time measuring unit) 65 outputs the voltage Va corresponding to the arrival time of the first-received reference signal, the voltage Vb corresponding to the arrival time of the second-received reference signal, and the voltage Vc corresponding to the arrival time of the third-received reference signal. After obtaining a predetermined number of voltage values Va, Vb, and Vc, the voltage measurer (the delay time measuring unit) 65 determines the average values of the voltage values Va, Vb, and Vc, as shown in FIG. 15. Based on the average values, the voltage differences V1 and V2 are calculated. The procedures after this step are the same as those of the fourth embodiment, and therefore, explanation of them is omitted herein.

Sixth Embodiment

Next, a sixth embodiment of the present invention is described. In this embodiment, the correlations between the reference signals that are output from the reference signal generator 54 of the transmission device 50 and correlation reference pulses that are generated from the reception device 60 are calculated. Based on the correlation values, the phase differences among the RGB signals are determined.

The transmission device 50 of this embodiment has the same structure as the transmission device 50 of the fourth embodiment. However, the signal to be output from the reference signal generator 54 maintains a predetermined voltage over a predetermined period of time.

Figure 17:
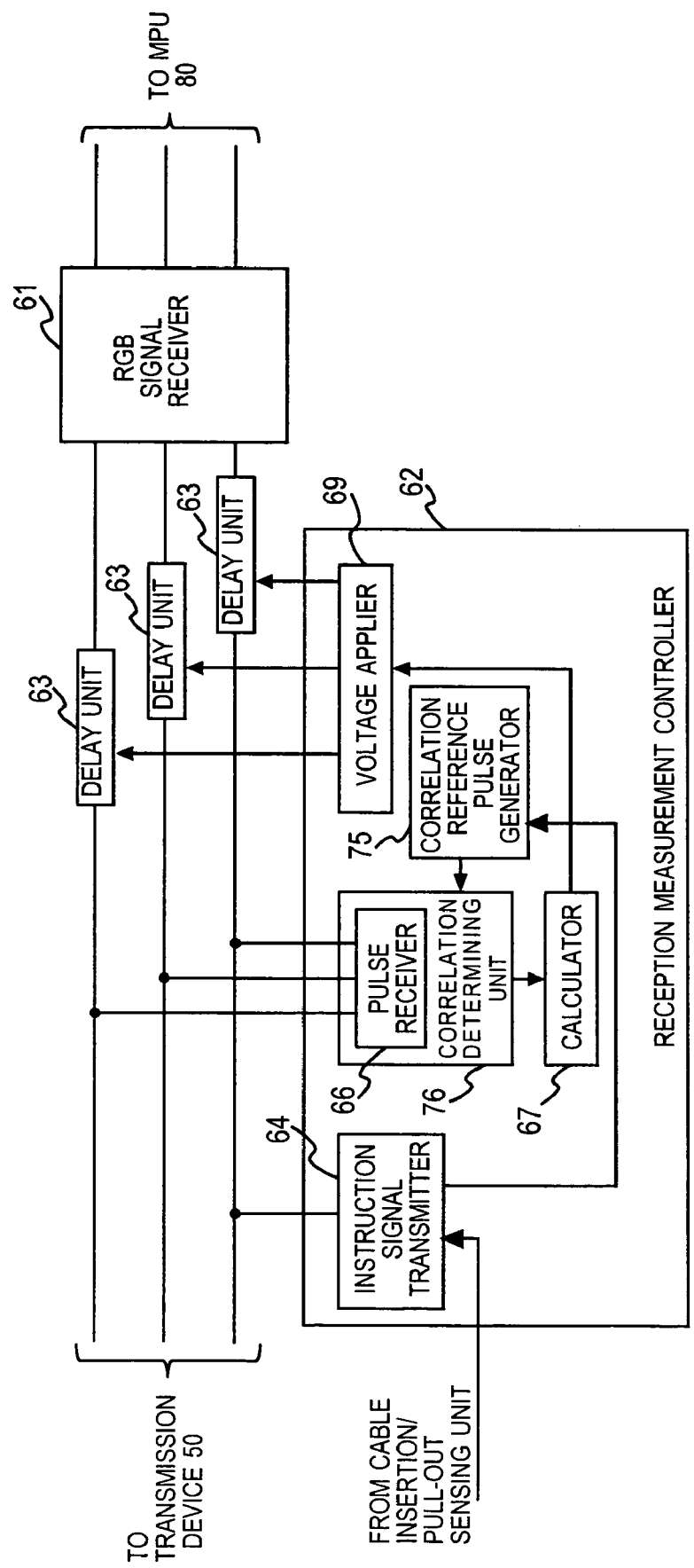
FIG. 17 illustrates the structure of the reception measurement controller of the sixth embodiment.

Referring now to FIG. 17, the structure of the reception device 60 is described. The reception measurement controller 62 of this embodiment includes a correlation reference pulse generator (a correlation reference signal generating unit) 75 that generates correlation reference pulses, and a correlation value determining unit (a correlation value calculating unit) 76.

The signal that is output from the correlation reference pulse generator 75 also maintains a predetermined voltage over a predetermined period of time. The correlation reference pulse generator 75 generates a correlation reference pulse a predetermined time after the output of an instruction signal from the instruction signal transmitter 64.

Figure 18:
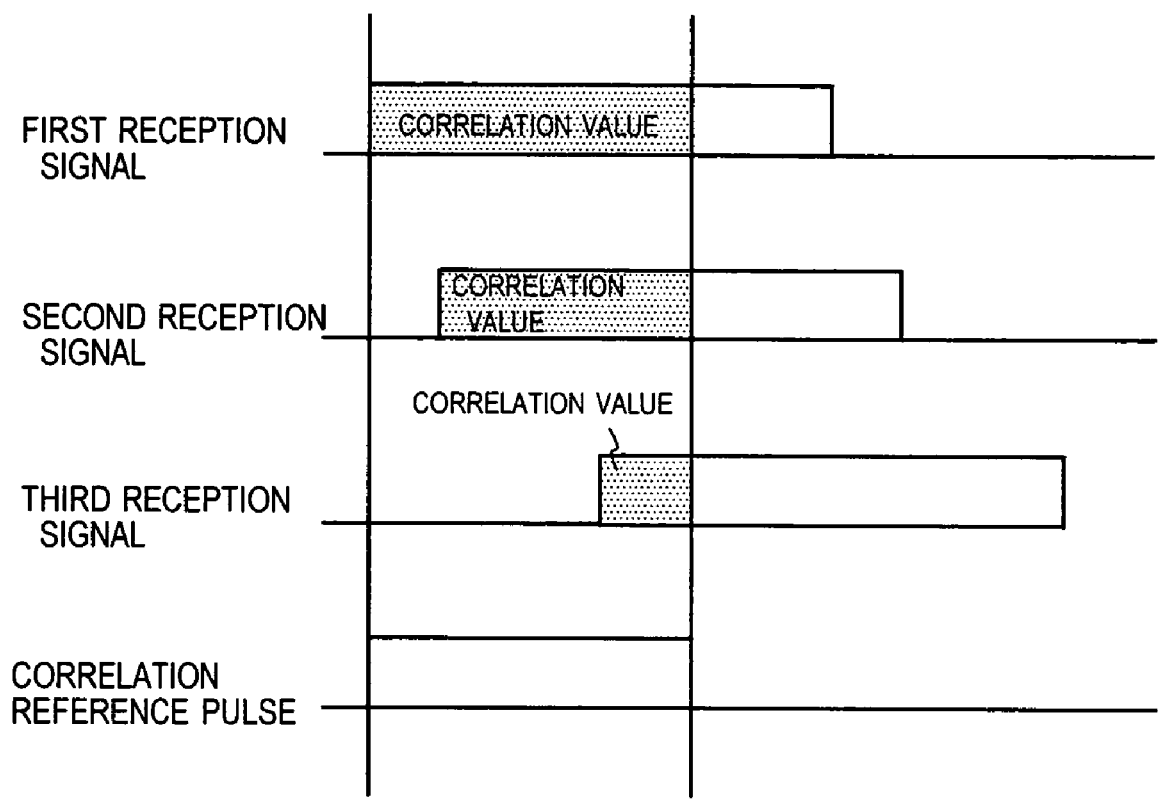
FIG. 18 illustrates the method of determining correlation values by the correlation value determining unit.

The correlation value determining unit (the correlation value calculating unit) 76 performs an integration calculation to determine the correlation values between the RGB reference signals received through the pulse receiver 66 and the correlation reference pulses generated from the correlation reference pulse generator (the correlation reference signal generating unit) 75. Based on the correlation values determined by the correlation value determining unit (the correlation value calculating unit) 76, the calculator (the correcting unit) 67 determines the phase differences among the RGB signals. Since the correlation values become smaller in proportion to the delay time as shown in FIG. 18, the calculator (the correcting unit) 67 determines the phase differences among the RGB signals, i.e., the signal delay times, in accordance with the correlation values. The operations of the other components of the reception device 60 of this embodiment are the same as those of the fourth embodiment, and therefore, explanation of them is omitted herein.

Figure 19:
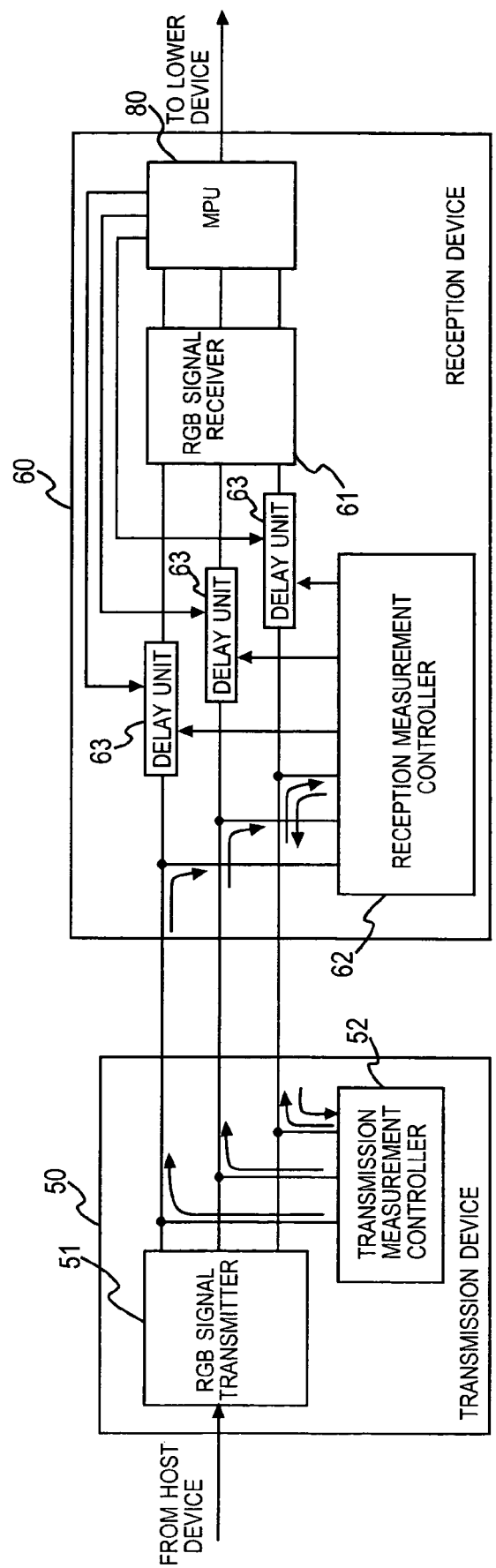
FIG. 19 illustrates the structure of a modification of any of the fourth through sixth embodiments.

As a modification of any of the fourth through sixth embodiments, it is possible to employ a structure in which the cable insertion/pull-out sensing circuits 15 and 25 are not provided, and phase differences are measured and corrected at predetermined intervals or when the power supply is turned on. FIG. 19 illustrates this structure.

Figure 20:
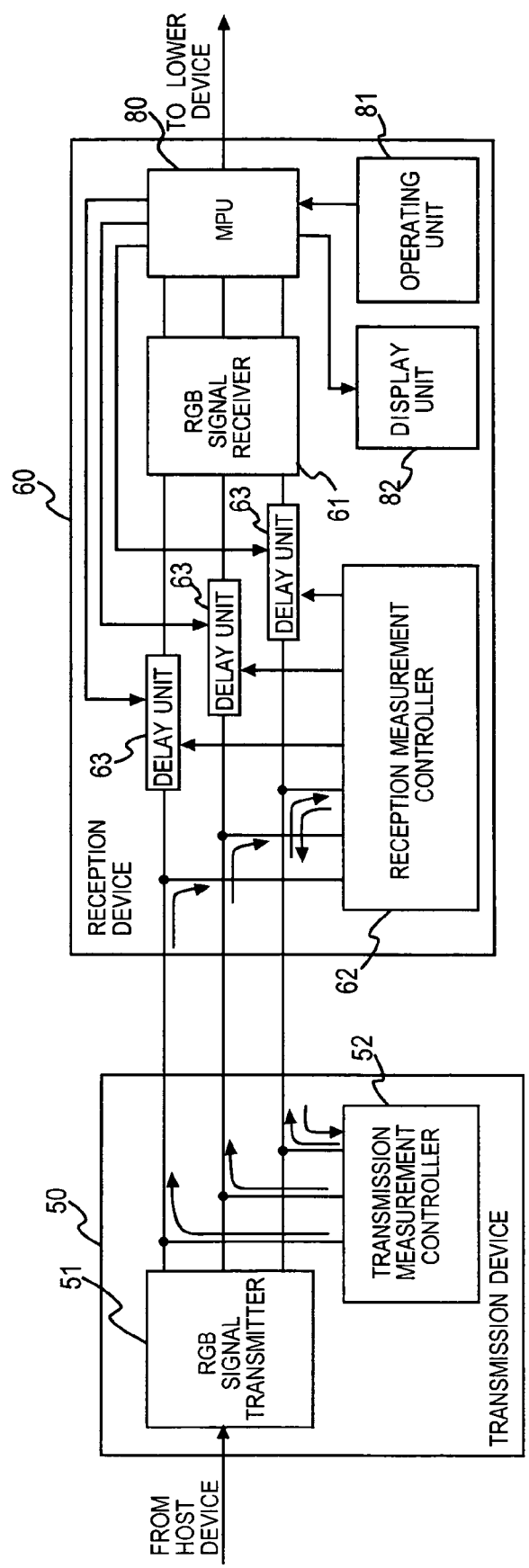
FIG. 20 illustrates the structure of another modification of any of the fourth through sixth embodiments.
Figure 21:
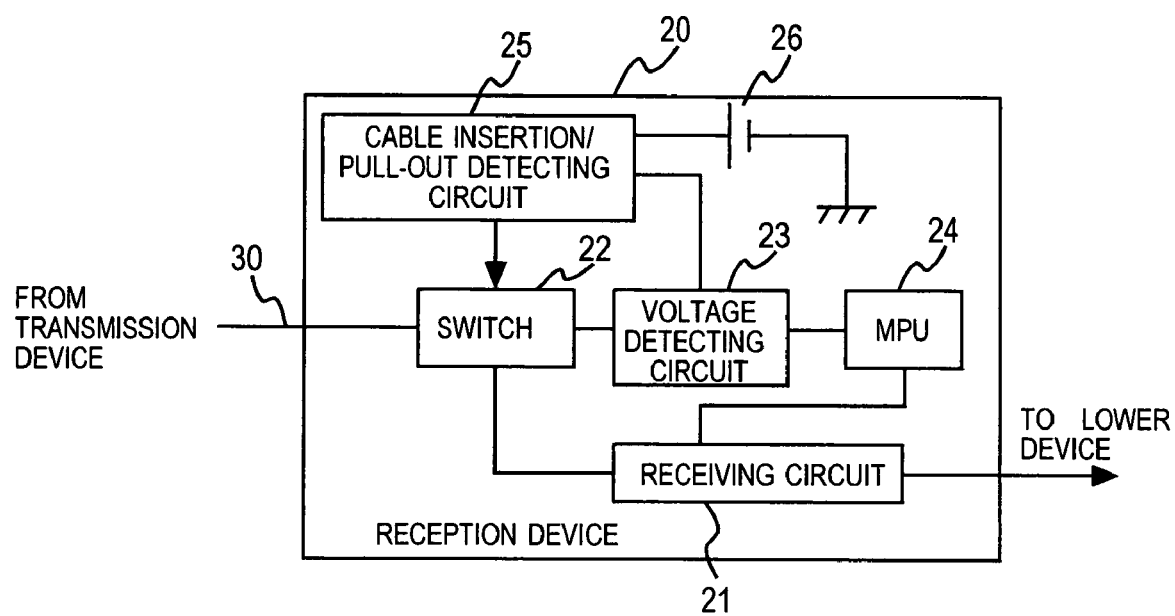
FIG. 21 is a block diagram illustrating the structure of a seventh embodiment of the present invention.
Figure 22:
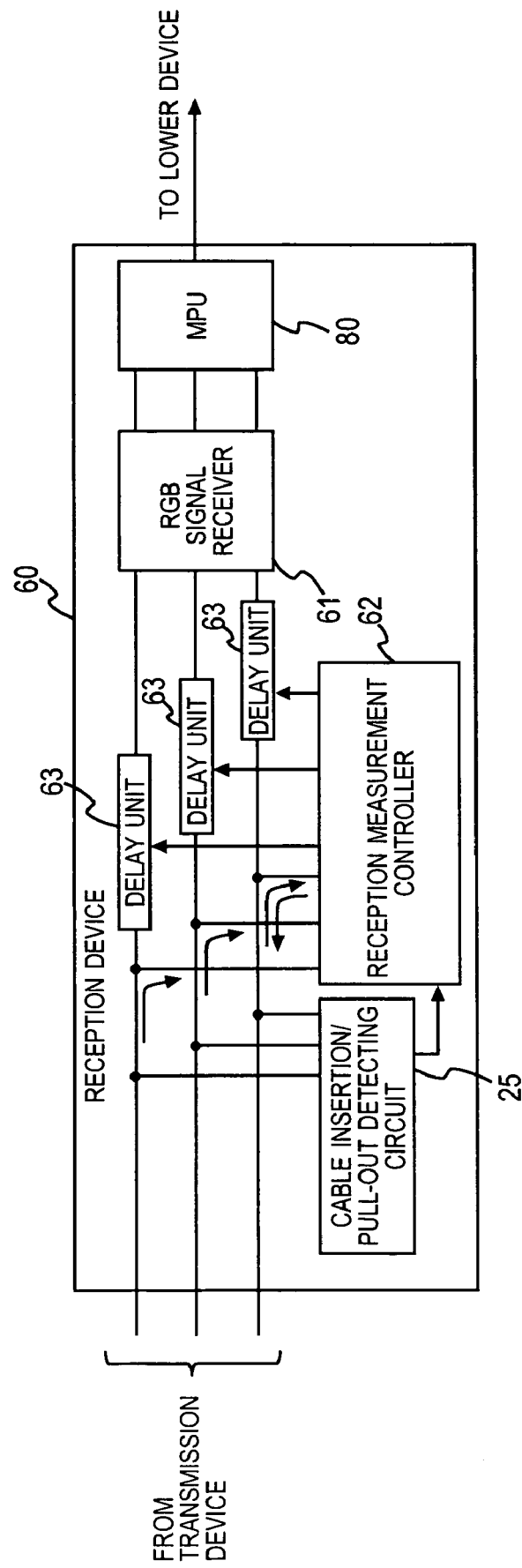
FIG. 22 is a block diagram illustrating the structure of an eighth embodiment of the present invention.

In any of the fourth through sixth embodiments, it is also possible to employ an operating unit 81 and a display unit 82, as shown in FIG. 20. A signal that is delayed in accordance with a signal delay time set by the operating unit 81 may be displayed on the display unit 82. With this structure, a signal delay time can be set with reference to the display on the display unit 82, and the optimum point can be easily grasped.

Seventh Embodiment

Next, a seventh embodiment of the present invention is described. This embodiment provides an automatic adjustment device, and is formed only with the reception device 20 of any of the first through third embodiments. The structure and operation of the reception device 20 are the same as those of any of the first through third embodiments, and therefore, explanation of them is omitted herein.

In this structure formed only with the reception device 20, when the cable insertion/pull-out sensing circuit 25 senses that the cable 30 is connected, the voltage detecting circuit 23 that measures a signal voltage is connected to the cable 30, so as to measure the signal voltage. Based on the measured signal voltage, signal attenuation is determined, and gain of the receiving circuit 21 is adjusted. Since the gain of the receiving circuit 21 is adjusted only when the cable 30 is pulled out from the connector and is re-connected, gain adjustment is performed only when the cable 30 is exchanged for another cable or when the cable length changes due to a cable exchange.

Eighth Embodiment

Next, an eighth embodiment of the present invention is described. This embodiment also provides an automatic adjustment device, and is formed only with the reception device 60 of any of the fourth through sixth embodiments. The structure and operation of the reception device 60 are the same as those of any of the fourth through sixth embodiments, and therefore, explanation of them is omitted herein.

The reception device 60 of this embodiment also measures the arrival time differences among reference signals, after receiving the reference signals that are simultaneously output through signal lines. Based on the measured arrival time differences, phase differences are corrected. In this manner, the phase difference correction can be performed with precision. Also, since the phase differences among signals are determined in accordance with the reference signals that are simultaneously output through the signal lines, it is not necessary to transmit other synchronization signals such as a horizontal synchronization signal or a vertical synchronization signal.

Figure 23:
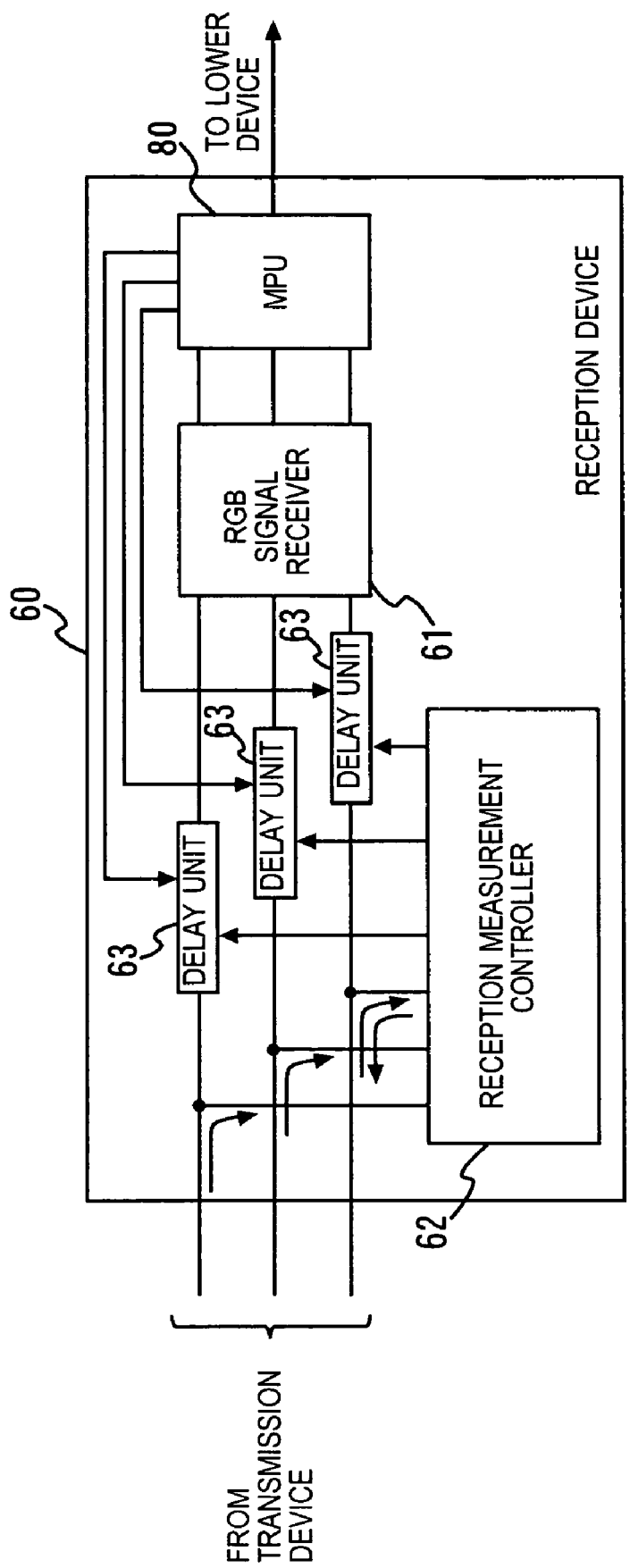
FIG. 23 illustrates the structure of a modification of the eighth embodiment.
Figure 24:
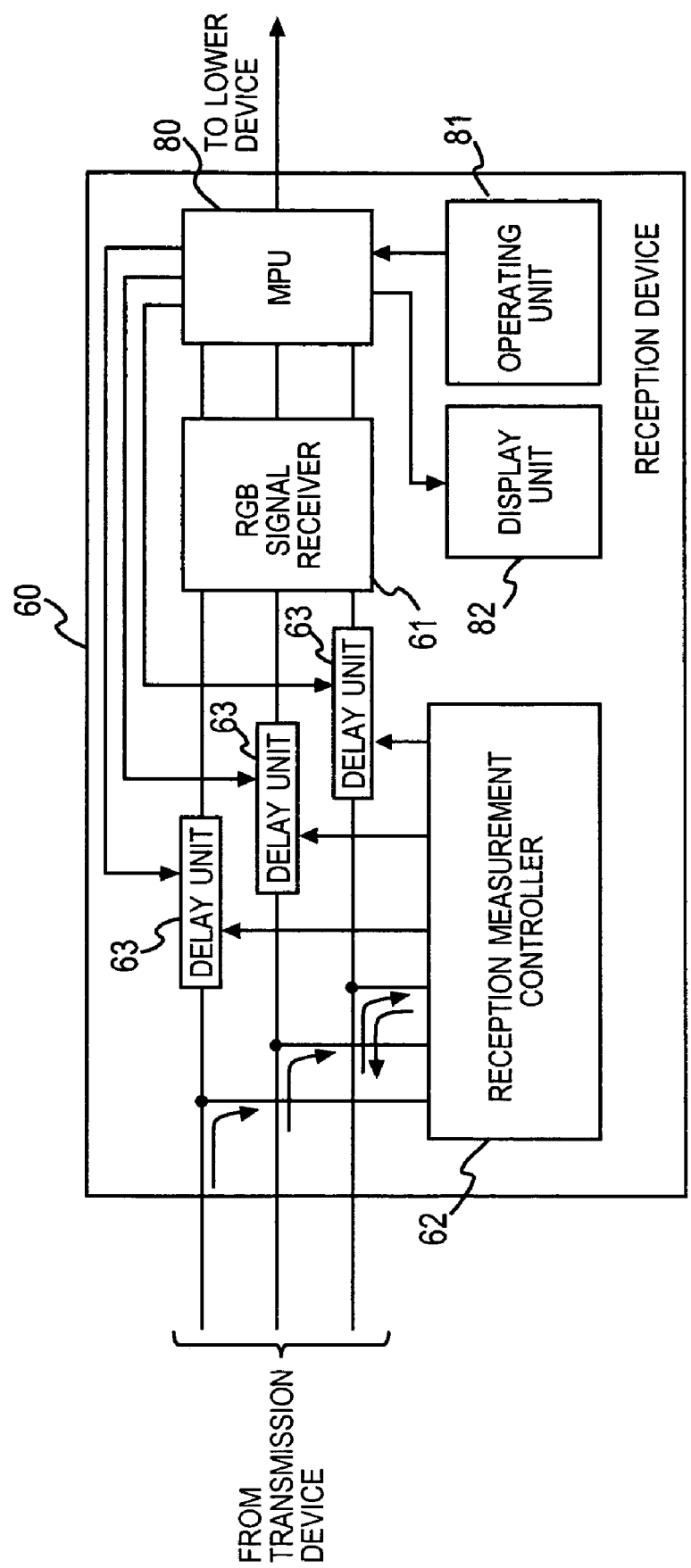
FIG. 24 illustrates the structure of another modification of the eighth embodiment.

As a modification of this embodiment, it is possible to employ a structure in which the cable insertion/pull-out sensing circuit 25 is not provided, and phase differences are measured and corrected at predetermined intervals or when the power supply is turned on. FIG. 23 illustrates this structure. Alternatively, it is also possible to employ an operating unit 81 and a display unit 82, as shown in FIG. 24. A signal that is delayed in accordance with a signal delay time set by the operating unit 81 may be displayed on the display unit 82.

Next, a structure in which the transmission devices 10 and 50 and the reception devices 20 and 60 of the first through eighth embodiments are mounted on a remote control unit 110 is described. In this structure, computer devices 100, 101, . . . are connected to consoles such as a monitor 91, a keyboard 92, and a mouse 93, with the remote control unit 110. The remote control unit 110 has computer-side devices 120, 124, . . . and a console-side device 130.

Each of the computer-side devices 120, 124, . . . has the respective function units for the monitor, the keyboard, and the mouse. The console-side device 130 also has the function units for the monitor, the keyboard, and the mouse. In the computer-side devices 120 and 124, monitor transmitters 121 and 125, keyboard receivers 122 and 126, and mouse receivers 123 and 127 are provided. Likewise, in the console-side device 130, a monitor receiver 131, a keyboard transmitter 132, and a mouse transmitter 133 are provided.

As data such as images are transmitted from the computer devices 100 and 101 to the monitor 91, the monitor transmitter 121 is provided in the computer-side device 121, and the monitor receiver 131 is provided in the console-side device 130. The monitor transmitter 121 is equivalent to any of the transmission devices 10 and 50 of the first through eighth embodiments. The monitor receiver 131 is equivalent to any of the reception devices 20 and 60 of the first through eighth embodiments.

As the input from the keyboard 92 is input to the computer devices 100 and 101, the keyboard receivers 122 and 126 are provided in the computer-side devices 120 and 124, respectively, and the keyboard transmitter 132 is provided in the console-side device 130. The mouse receivers 123 and 127 are provided in the computer-side devices 120 and 124, respectively, and the mouse transmitter 133 is provided in the console-side device 130.

When the computer device 100 is connected to the console (the monitor 91, the keyboard 92, and the mouse 93, the remote control unit 110 is switched so that the computer-side device 120 is connected to the console-side device 130. By doing so, the signal representing the monitor terminal of the computer device 100 is transmitted to the monitor 91 via the monitor transmitter 121 and the monitor receiver 131. Likewise, the signal from the keyboard 92 is input to the keyboard terminal of the computer device 100 via the keyboard transmitter 132 and the keyboard receiver 122.

The above described embodiments are preferred embodiments of the present invention. However, the present invention is not limited to those embodiments, and various changes and modifications can be made without departing from the scope of the present invention. For example, the automatic adjustment system for performing gain adjustment in accordance with any of the first through third embodiments may be combined with the automatic adjustment system that corrects phase differences in accordance with any of the fourth through sixth embodiments. In such a case, when insertion/pull-out of the cable 30 is detected, the length of the inserted cable 30 is measured, and gain adjustment is performed. Also, the phase differences among the signal lines contained in the cable 30 can be adjusted.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An automatic adjustment system having a cable insertion/pull-out sensing unit, comprising:
   a transmission device including a constant voltage output unit outputting a constant-voltage signal to a cable; and
   a reception device including a voltage detecting unit and a control unit, the voltage detecting unit receiving the constant-voltage signal transmitted through the cable and detecting the voltage of the constant-voltage signal, the control unit determining signal attenuation based on a voltage detected by the voltage detecting unit and adjusting a gain of a receiving unit receiving the constant-voltage signal from the transmission device upon detecting, by the cable insertion/pull-out sensing unit, a connection of the cable to a connector without requiring a powering on after the connection.

2. The automatic adjustment system as claimed in claim 1, wherein the cable insertion/pull-out sensing unit is provided in both the transmission device and the reception device.

3. The automatic adjustment system as claimed in claim 2, wherein the cable insertion/pull-out sensing unit and the constant voltage output unit of the transmission device are driven with a battery.

4. The automatic adjustment system as claimed in claim 2, wherein the cable insertion/pull-out sensing unit and the voltage detecting unit of the reception device are driven with a battery.

5. The automatic adjustment system as claimed in claim 1, wherein the transmission device and the reception device each have a switching unit that serial-connects a plurality of signal lines contained in the cable, thereby virtually elongating the cable length.

6. The automatic adjustment system as claimed in claim 1, wherein:
   the voltage detecting unit detects the voltage of the constant voltage signal that is output from the constant voltage output unit a plurality of times, and determines the average value of the constant voltage; and
   the control unit adjusts the gain of the receiving unit based on the average value.

7. The automatic adjustment system as claimed in claim 6, wherein the voltage detecting unit eliminates the largest value and the smallest value from a plurality of voltages, and then determines the average value of the plurality of voltages.

8. An automatic adjustment system, comprising:
   a transmission device including a constant voltage output unit outputting a constant-voltage signal to a cable and a cable insertion/pull-out sensing unit, the cable insertion/pull-out sensing unit and the constant voltage output unit being driven by a battery; and
   a reception device including a voltage detecting unit, a control unit, and a cable insertion/pull-out sensing unit, the voltage detecting unit receiving the constant-voltage signal transmitted through the cable and detecting the voltage of the constant-voltage signal, the control unit determining signal attenuation based on a voltage detected by the voltage detecting unit and adjusting a gain of a receiving unit receiving the constant-voltage signal from the transmission device when the cable insertion/pull-out sensing unit senses that the cable is connected to a connector, wherein:

the cable insertion/pull-out sensing unit of the transmission device has a connection control unit that controls the connection of the constant voltage output unit to the cable; and the connection control unit starts supplying power from the battery to the voltage detecting unit when the cable is pulled out and the connecting control unit receives a power supply, connects the constant voltage output unit to the cable and outputs the constant-voltage signal to the cable when the connection of the cable is detected, and cuts off the power supply to the connection control unit and the constant voltage output unit when a predetermined period of time has passed since the connection of the cable.

9. An automatic adjustment system, comprising:

a transmission device including a constant voltage output unit outputting a constant-voltage signal to a cable and a cable insertion/pull-out sensing unit; and a reception device including a voltage detecting unit, a control unit, and a cable insertion/pull-out sensing unit, the cable insertion/pull-out sensing unit and the voltage detecting unit being driven by a battery, the voltage detecting unit receiving the constant-voltage signal transmitted through the cable and detecting the voltage of the constant-voltage signal, the control unit determining signal attenuation based on a voltage detected by the voltage detecting unit and adjusting a gain of a receiving unit receiving the constant-voltage signal from the transmission device when the cable insertion/pull-out sensing unit senses that the cable is connected to a connector, wherein:

the cable insertion/pull-out sensing unit of the reception device has a connection control unit that controls the connection of the voltage detecting unit to the cable; and the connection control unit starts supplying power from the battery to the voltage detecting unit when the cable is pulled out and the connecting control unit receives a power supply, connects the voltage detecting unit to the cable when the connection of the cable is detected, and cuts off the power supply to the connection control unit and the voltage detecting unit when a predetermined period of time has passed since the connection of the cable.

10. An automatic adjustment device comprising:

a cable insertion/pull-out sensing unit that senses that a cable is inserted or pulled out, and, when detecting that the cable is connected, connects a voltage detecting unit that measures a signal voltage to the cable; and a control unit that determines signal attenuation, based on the signal voltage measured by the voltage detecting unit, and adjusts a gain of a receiving unit that receives signals from a transmission end, the gain being adjusted upon detecting, by the cable insertion/pull-out sensing unit, a connection of the cable to a connector without requiring a powering on after the connection.

11. The automatic adjustment device as claimed in claim 10, wherein the cable insertion/pull-out sensing unit and the voltage detecting unit are driven by a battery.

12. The automatic adjustment device as claimed in claim 10, wherein:

the voltage detecting unit detects the voltage of a constant-voltage signal that is transmitted from the transmission end a plurality of times, and determines the average value of the voltage values; and the control unit controls the gain of the receiving unit, based on the average value.

13. The automatic adjustment device as claimed in claim 12, wherein the voltage detecting unit eliminates the largest value and the smallest value from the voltage values, and then determines the average value of the voltage values.

14. An automatic adjustment device, comprising:

a cable insertion/pull-out sensing unit that senses that a cable is inserted or pulled out, and, when detecting that the cable is connected, connects a voltage detecting unit that measures a signal voltage to the cable, the cable insertion/pull-out sensing unit and the voltage detecting unit being driven by a battery; and a control unit that determines signal attenuation, based on the signal voltage measured by the voltage detecting unit, and adjusts a gain of a receiving unit that receives signals from a transmission end, wherein:

the cable insertion/pull-out sensing unit comprises a connection control unit that controls the connection of the voltage detecting unit to the cable;

the connection control unit starts supplying the battery power source to the voltage detecting unit, when receiving the power supply from the battery as the cable is pulled out; and the voltage detecting unit is connected to the cable when the connection of the cable is detected, and the power supply to the connection control unit and the voltage detecting unit is cut off when a predetermined period of time has passed since the connection of the cable.

15. An automatic adjustment method comprising:

transmitting a constant-voltage signal to a reception end through a cable;

receiving the constant-voltage signal transmitted through the cable, and detecting the voltage of the constant-voltage signal that is received by a receiving unit; and determining signal attenuation based on the detected voltage, and adjusting a gain of the receiving unit that receives the transmitted signal, the gain being adjusted upon detecting a connection of the cable to a connector without requiring a powering on after the connection.

16. An automatic adjustment method comprising:

transmitting a constant-voltage signal through a cable;

detecting the voltage of the constant-voltage signal that is received by a receiving unit; and adjusting a gain of the receiving unit that receives the transmitted signal, based on the detected voltage, the gain being adjusted upon detecting a connection of the cable to a connector without requiring a powering on after the connection.

* * * * *